US006812518B2

(12) United States Patent
Miida

(10) Patent No.: US 6,812,518 B2
(45) Date of Patent: Nov. 2, 2004

(54) SEMICONDUCTOR MEMORY HAVING STORAGE CELLS STORING MULTIPLE BITS AND A METHOD OF MANUFACTURING THE SAME

(75) Inventor: Takashi Miida, Kanagawa (JP)

(73) Assignee: Innotech Corporation, Kanagawa (JP)

(*) Notice: Subject to any disclaimer, the term of this patent is extended or adjusted under 35 U.S.C. 154(b) by 0 days.

(21) Appl. No.: 10/285,540

(22) Filed: Nov. 1, 2002

(65) Prior Publication Data

US 2003/0080356 A1 May 1, 2003

(30) Foreign Application Priority Data

Nov. 1, 2001 (JP) ....................................... 2001-336822
Oct. 18, 2002 (JP) ....................................... 2002-303845

(51) Int. Cl.[7] .............................................. H10L 29/788
(52) U.S. Cl. ........................ 257/315; 257/314; 438/257
(58) Field of Search ................................ 257/314–316; 438/201, 211, 257, 266

(56) References Cited

U.S. PATENT DOCUMENTS 6,091,101 A 7/2000 Wang
6,133,098 A * 10/2000 Ogura et al. ................ 438/267
6,137,134 A 10/2000 Nakagawa
6,157,061 A 12/2000 Kawata
6,335,554 B1 1/2002 Yoshikawa
2002/0014666 A1 2/2002 Ohmi et al.

FOREIGN PATENT DOCUMENTS

JP 201-156188 A 6/2001
JP 2001-160555 A 6/2001
JP 3249811 B1 11/2001
JP 3249812 B1 11/2001
JP 3283872 B1 3/2002

OTHER PUBLICATIONS

Paper No. 29–p–YC–4, The Joint Meeting of Engineers of Applied Physics of Japan, p. 38.

* cited by examiner

*Primary Examiner*—Dung A. Le
(74) *Attorney, Agent, or Firm*—Birch, Stewart, Kolasch & Birch, LLP.

(57) ABSTRACT

A multiple-bit cell transistor includes a P type silicon substrate, agate insulation layer, a pair of N type source/drain regions, a pair of tunnel insulation layers, and a pair of floating gates. The silicon substrate is formed with a projection while the floating gates each are positioned on one of opposite side walls of the projection. Inter-polycrystalline insulation layers each are formed on one of the floating gates. A control gate faces the top of the projection via the gate insulation layer. An N type region is formed on each side of the projection and contacts the source/drain region adjoining it. The cell transistor lowers a required write voltage, broadens a current window, and enhances resistance to inter-band tunneling.

32 Claims, 31 Drawing Sheets

SEMICONDUCTOR MEMORY HAVING STORAGE CELLS STORING MULTIPLE BITS AND A METHOD OF MANUFACTURING THE SAME

This nonprovisional application claims priority under 35 U.S.C. §119(a) on Patent Application No. 2001-336822 and 2002-303845 filed in JAPAN on Nov. 1, 2001 and Oct. 18, 2002, which is herein incorporated by reference.

BACKGROUND OF THE INVENTION

1. Field of the Invention

The present invention relates to a transistor, a semiconductor memory including the same, and a method of manufacturing a transistor. More particularly, the present invention relates to a technology useful for a semiconductor memory having storage cells each storing multiple bits.

2. Description of the Background Art

Today, nonvolatile memories including EEPROMs (Electrically Erasable Programmable Read-Only Memories) are widely applied to, e.g. mobile telephones. An EEPROM, for example, usually allows only one bit of information to be stored in each storage cell transistor. However, to promote size reduction of the device, there should preferably be implemented the multiple-bit configuration of a cell transistor that allows two or more bits of information to be stored in the cell transistor.

FIG. 29 of the drawings shows a storage cell transistor with a multiple-bit configuration taught in U.S. Pat. No. 6,011,725 by way of example. As shown, the cell transistor, generally 1, has a so-called MONOS (Metal Oxide Nitride Oxide Semiconductor) structure made up of a control gate electrode (metal) 7, a silicon oxide layer (oxide) 6, a silicon nitride layer (nitride) 5, a silicon oxide layer (oxide) 4, and a P type silicon substrate (semiconductor) 2 in the order.

In the cell transistor 1, N type source/drain regions 3 and 8 each selectively become a source or a drain electrode at various stages of a write-in or a read-out sequence. In other words, it is indefinite which of the source/drain regions 3 and 8 functions as a source or a drain electrode. In the following description, one of the source/drain regions 3 and 8 that discharges an electric carrier, which may be electrons in this specific case, and the other region will be referred to as a source and a drain region, respectively.

FIG. 30A demonstrates how data is written to the storage cell transistor 1. As shown, the source region 8 is grounded while suitable positive voltages $V_{D1}$ and $V_{G1}$ are applied to the drain region 3 and the control gate 7, respectively. In this condition, an electric field is established between the source region 8 and the drain region 3 and accelerates electrons, so that hot electrons are generated in the vicinity of the drain region 3. The hot electrons thus generated are injected into the silicon nitride layer 5 over the potential barrier formed by the silicon oxide layer 4 due to the collision thereof against phonons and the positive potential of the control gate electrode 7. Because the silicon nitride layer 5 is not electrically conductive, the hot electrons injected into the silicon nitride layer 5 localize in the vicinity of the drain region 3, forming a right bit 9*a* of information stored. This storage condition is representative of a stored-bit state (1, 0).

FIG. 30B shows a condition wherein the source and drain voltages of FIG. 30A are replaced with each other. As shown, the hot electrons injected into the silicon nitride layer 5 localize in the vicinity of the drain region 8, forming a left bit 9*b* of information stored. This sets up a storage state (0, 1).

FIGS. 31A through 31D show four different logical storage states available with the cell transistor 1. As shown in FIG. 31A, when electrons are not stored in either one of the right and left bit positions, a state (1, 1) is set up. As shown in FIG. 31D, when electrons are stored in both of the right and left bit positions, a state (0, 0) is set up. In this manner, the cell transistor 1 allows two-bit data to be stored therein. To read out the data from the cell transistor 1, the voltages applied to the source region 8 and drain region 3 are replaced with each other from write-in condition to measure a drain current two times while each drain current measured is compared with a reference current value, as will be described more specifically hereinafter.

In the state (0, 0) shown in FIG. 31D, electrons localize at both of the right and left bit positions 9*a* and 9*b*, so that the potential of the silicon nitride layer 5 is lowest among the four states. Consequently, the threshold voltage of the cell transistor 1 becomes highest and causes substantially no drain current to flow. The value of the drain current remains the same even when the voltages applied to the source region 8 and drain region 3 are replaced, and is almost zero. As a result, the drain currents sequentially measured both are determined to be smaller than the reference current.

In the state (1, 1) shown in FIG. 31A, electrons are absent from both of the right and left bit positions 9*a* and 9*b*, so that the potential of the silicon nitride layer 5 is highest among the four states. Therefore, the threshold voltage of the transistor 1 becomes lowest among the four states, causing the greatest drain current to flow. The value of the drain current remains the same even when the source region 8 and drain region 3 are replaced with each other, and is greatest among the four states. As a result, the drain currents measured one after the other are both determined to be greater than the reference current.

On the other hand, in the states (1, 0) and (0, 1) shown in FIGS. 31B and 31C, respectively, electrons localize at only one of the right and left bit positions, making the cell transistor 1 asymmetrical in the right-and-left direction with respect to potential distribution. The drain currents sequentially measured are different from each other when the voltages applied to the source region 8 and drain region 3 are replaced. It is therefore possible to distinguish the states (1, 0) and (0, 1) by determining which of the two drain currents sequentially measured is greater or smaller than the reference current.

However, the cell transistor 1 with the structure described above has some problems left unsolved, as will be described hereinafter. First, in the event of write-in, see FIGS. 30A and 30B, to allow hot electrons to be injected into the silicon nitride layer 5, the high voltage $V_{G1}$ must be applied to the control gate 7. More specifically, for the injection of hot electrons, it is necessary to tunnel hot electrons from the conduction band of the silicon substrate 2 to the conduction band of the silicon oxide layer 4. An energy difference between the above two conduction bands is about 3.2 electron volts (eV). However, the hot electrons lose energy on colliding against phonons present in the silicon substrate 2 and cannot be tunneled between the two conduction bands mentioned above even if a voltage of 3.2 volts (V) is applied to the control gate 7. In practice, therefore, the voltage $V_{G1}$ applied to the control gate 7 must be as high as 12 V to 13 V.

While the above high voltage is expected to be applied to the control gate 7 from a highly voltage-resistant transistor included in a decoder circuit, not shown, such a transistor cannot be miniaturized because miniaturization would cause punch-through to occur between the source and the drain electrode of the transistor. It is therefore impossible with the prior art structure described above to reduce the chip size of the entire EEPROM including the decoder circuit.

Second, the current window for distinguishing the drain currents is smaller when the state (1, 0) or (0, 1) is sensed. A current window refers to a difference between the drain currents measured one after the other by replacing the voltages applied to the source and drain regions 3 and 8 in the event of sensing the states (1, 0) and (0, 1) The current window definitely opens when electrons distinctly localize at the right end or the left end of the silicon nitride layer 5, i.e. when the cell transistor 1 is clearly asymmetrical in the right-and-left direction in potential or electron distribution.

Asymmetry, however, does not clearly appear in the cell transistor 1 because electrons are distributed in the silicon nitride layer 5 over some breadth. Particularly, when a gate length L, see FIG. 30A, is reduced for reducing the cell size, it is not clear at which of the right and left bit positions electrons localize, further reducing the asymmetry of the cell transistor 1 and therefore the current window. Such a small current window reduces the margins of the drain and reference currents and thereby aggravates incorrect identification of stored data.

Third, resistance to inter-band tunneling available with the prior art structure is low, as will be described herein after with reference to FIG. 32. FIG. 32 shows a condition wherein the cell transistor 1 is not selected. As shown, to make the cell transistor 1 unselected, a ground potential lower than the potential assigned to read-out is applied to the control gate 7. On the other hand, the positive potential VD1 is applied to the drain electrode of a cell transistor selected. Because the positive potential VD1 is common to all of the cells in the direction of column of the memory device, it is applied to the drain region 3 of the cell transistor 1 as well.

In the condition shown in FIG. 32, a potential difference $\Delta V$ between the silicon nitride layer 5 and the drain region 3 is greater than in the case off read-out because the potential of the control gate 7 is lowered. Particularly, when electrons localize in the silicon nitride layer 5, the potential difference $\Delta V$ further increases because the electrons lower the potential of the silicon nitride layer 5. If the potential difference $\Delta V$ is great, then a tunnel current flows between the drain region 3 and the silicon nitride layer 5 and causes the silicon oxide layer 4 to deteriorate.

Moreover, a greater potential difference $\Delta V$ produces a stronger electric field at the edge of the drain region 3, so that breakdown is apt to occur at the PN junction of the drain region 3 and silicon substrate 2. The breakdown causes hot holes and electrons to appear in pairs, as shown in an enlarged view in a circle 100 in the figure. The hot holes 102 are attracted toward the lower potential side and therefore passed through the silicon oxide layer 4, deteriorating the layer 4. The low resistance to inter-band tunneling mentioned earlier refers to the circumstances described above.

SUMMARY OF THE INVENTION

It is an object of the present invention to provide a multiple-bit transistor capable of writing data with a reduced voltage with an increased current window and higher resistance to inter-band tunneling achieved than conventional, a semiconductor memory including such a multiple-bit transistor, and a method of manufacturing such a multiple-bit transistor.

In accordance with the present invention, a transistor comprising a one-conductivity type semiconductor substrate formed with a projection having a pair of side walls facing each other, a first insulation layer formed on a top of the projection, a pair of source/drain regions formed on a surface of the semiconductor substrate at both sides of the projection, second insulation layers each covering one of the pair of side walls and one of said source/drain regions adjoining the side wall, a pair of floating gates respectively formed on the pair of side walls of the projection and respectively facing the side walls and the source/drain regions via respective second insulation layers, third insulation layers each being formed on one of the floating gates, and a control gate facing the pair of floating gates via third insulation layers and facing the top of the projection via the first insulation layer. The projection has a root portion formed to connect the source/drain regions with a straight line, the root portion being higher in concentration of the one conductivity type of impurity than a remaining portion of the projection.

Alternatively, the control gate may form a first capacitance against the top of the projection via the first insulation layer, and the floating gates may form a second capacitance against the side walls of the projection and the source/drain regions via the second insulation layers, the second capacitance being higher than the first capacitance.

Further alternatively, the floating gates may be coupled in capacitance with a second capacitance established against the side walls and of the projection and the source/drain regions via the second insulation layers, and a third capacitance established against the control gate via the third insulation layers, the second capacitance being formed larger.

Alternatively, the transistor may further comprise counter-conductivity type regions formed on the side walls of the projection and contacting the source/drain regions.

Advantageously, the control gate may comprise first control gate segments facing the floating gates via the third insulation layers and a second control gate segment facing the top of the projection via the first insulation layer. The first and second control gates may be formed to be electrically interconnected. Alternatively, the first and second control gates may be formed to be controlled electrically independently of each other.

Also, in accordance with the present invention, a semiconductor memory includes a plurality of cell transistors each having the configuration described above.

Further, in accordance with the present invention, a method of manufacturing a transistor, comprising the steps of implanting an impurity into a primary surface of a one-conductivity type semiconductor substrate to form a first region with lower impurity concentration and a second region with higher impurity concentration in an order from the primary surface in a depth direction of the substrate, forming trenches in the primary surface to a depth at which the trench has a bottom reaching the second region to form a projection having a pair of side walls opposite to each other, implanting a counter-conductivity type impurity in the bottom of the trench to form a source/drain region at the bottom, forming a first insulation layer on the source/drain region and the side walls of the trench, forming a floating gate at least partially on the side walls of the projection and the source/drain region via the first insulation layer, forming a second insulation layer on a top of the projection, forming a third insulation layer on the floating gate, and forming a control gate on the second and third insulation layers.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENT

Figure 1:
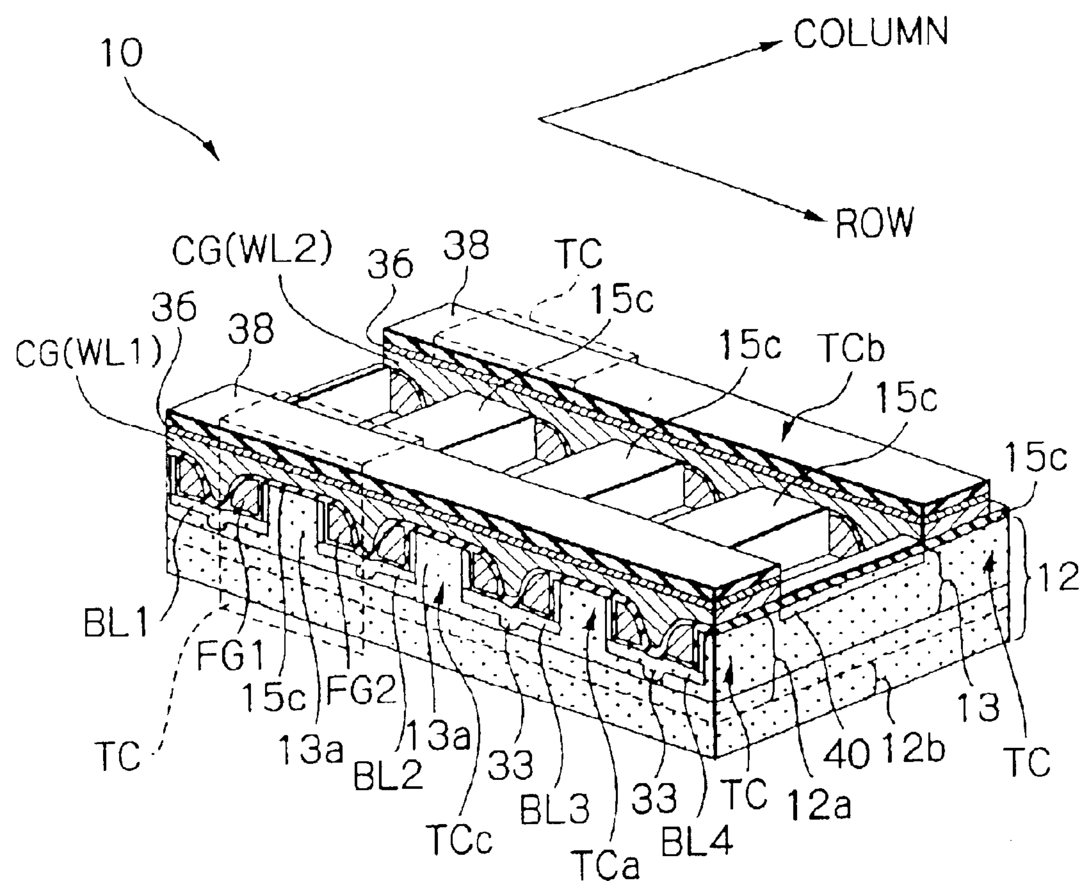
FIG. 1 is a fragmentary perspective view of a semiconductor memory embodying the present invention.

FIG. 1 of the accompanying drawings partially shows a semiconductor memory 10 including an array of storage cell transistors embodying the present invention. Briefly, in the illustrative embodiment, two kinds of control gate segment of each storage cell transistor integrally constitute a single control gate. Specifically, as shown in FIG. 1, the semiconductor memory 10 is formed on a P type silicon substrate 12, which is a one-conductivity type semiconductor substrate. The P type silicon substrate 12 is made up of a P+ type substrate 12*b* and a P type epitaxial layer 12*a* formed on one primary surface of the P+ type substrate 12*b*. A P type well 13 is formed in the P type epitaxial layer 12*a*.

A plurality of projections or ridges 13*a*, which are unique to the present invention, protrude from the primary surface of the P type silicon substrate 12. Bitlines BL1 through BL4 are formed on the surface of the P type well 13 at both sides of the projections 13*a*. More specifically, ions of an N type impurity, opposite in conductivity type to the P type well 13, are implanted in the surface of the P type well 13 at positions expected to form the bit lines BL1 through BL4. The bit lines BL1 through BL4 are arranged side by side in the direction of row of the memory cell array while extending in the direction of column each, although hidden by the other structural members and not clearly visible in the figure.

Floating gates FG1 and FG2 and a control gate CG are formed of polycrystalline silicon. More specifically, a plurality of control gates CG are arranged in the direction of column while extending in the direction of row each. The control gates CG respectively play the role of word lines WL1, WL2 and so forth. Tungsten silicon (WSi) layers 36 each serve to lower the resistance of particular one of the control gates CG while cap layers 38 each protect the control gate CG. The cap layers 38 are formed of silicon oxide.

Figure 2:
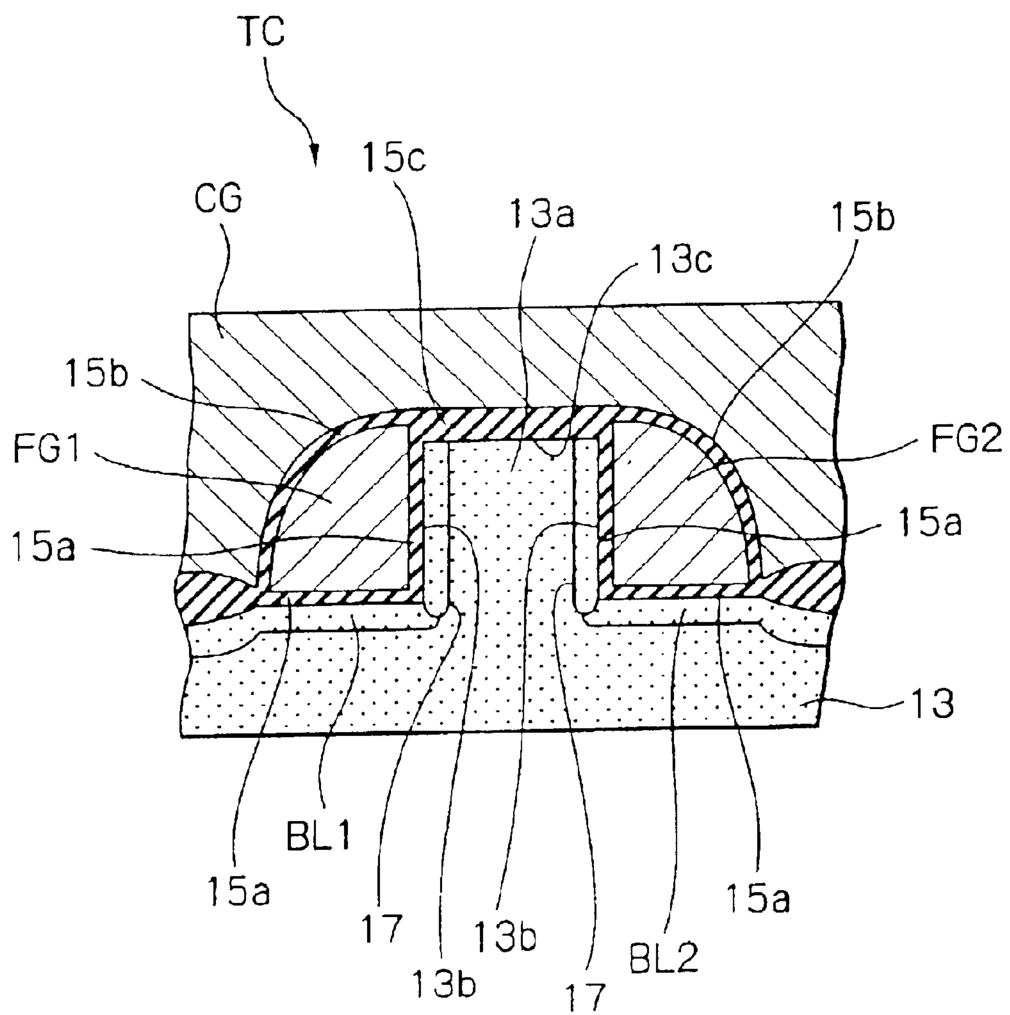
FIG. 2 shows an enlarged section of one of cell transistors included in the semiconductor memory of FIG. 1.

FIG. 2 is an enlarged view showing a cell transistor TC characterizing the present invention. As shown, the cell transistor TC includes the previously mentioned projection 13*a* and agate insulation layer or first insulation layer 15*c* formed on the top 13*c* of the projection 13*a*. The projection 13*a* has a pair of side walls 13*b* opposite to each other on which formed are counter-conductivity type, N type, regions 17 opposite in conductivity type to the projection 13*a*. The impurity concentration of the N type regions 17 is selected to fall between 1/100 and 1/0000, preferably 1/1000, as high as that of the bit lines BL1 and BL2. Tunnel insulation layers or second insulation layers 15*a* respectively cover one of the side walls 13*a* and bit line BL1 and the other side wall 13*b* and bit line BL2. The bit lines BL1 and BL2 bifunction as source/drain regions, as will be described specifically later. In this sense, the bit lines BL1 and BL2 will be sometimes referred to as source/drain regions.

The floating gates FG1 and FG2 respectively face the source/drain regions BL1 and BL2 and the opposite side walls 13*b* of the projection 13*a* via the tunnel insulation layers 15*a* adjoining them. Inter-polycrystalline insulation layers or third insulation layers 15*b* each are formed on one of the floating gates FG1 and FG2. The tunnel insulation layers 15*a*, inter-polycrystalline insulation layers 15*b* and gate insulation layer 15*c* all are formed of silicon oxide.

The control gate CG at least partly faces the floating gates FG1 and FG2 via the inter-polycrystalline insulation layers 15*b* and partly faces the top 13*c* of the projection 13*a* via the gate insulation layer 15*c*. Alternatively, the control gate CG may comprise segments facing the floating gates FG1 and FG2 with the inter-polycrystalline insulation layer 15*b* intervening in between and a segment facing the top surface 13*c* with the gate insulation layer 15*c* intervening in between, those segments being electrically separate from and electrically controlled independently of each other.

In the structure shown in FIG. 2, a channel region is formed on the surface layers of the opposite side walls 13*b* and top 13*c* of the projection 13*a* in a tridimensional configuration. This is contrastive to a conventional channel region which was formed in a single plane. Therefore, the cell transistor TC achieves a longer channel length while occupying a minimum of area and can therefore reduce the size of a memory device.

The P type impurity of the projection 13*a* has a concentration adjusted such that the cell transistor TC normally remains in its non-conductive or OFF state. More specifically, assume a condition wherein a preselected voltage is applied to the source/drain region BL1 or BL2. Then, the concentration of the P type impurity is adjusted such that when a potential difference between the so biased source/drain region BL1 or BL2 and the control gate CG is lower than a threshold voltage the channel region established in the vicinity of the top surface 13*c* of the ridge 13*a* in response to the control gate CG through the gate insulation layer 15*c* goes to its non-conductive state to resultantly render the cell transistor TC non-conductive, or when the potential difference is equal to or higher than the threshold voltage the transistor TC goes conductive. It is to be noted that the preselected voltage applied to the source/drain region BL1 or BL2 refers to a voltage $V_{DD}$ necessary for write-in, read-out and other various operations, as will be described later in detail.

Figure 3:
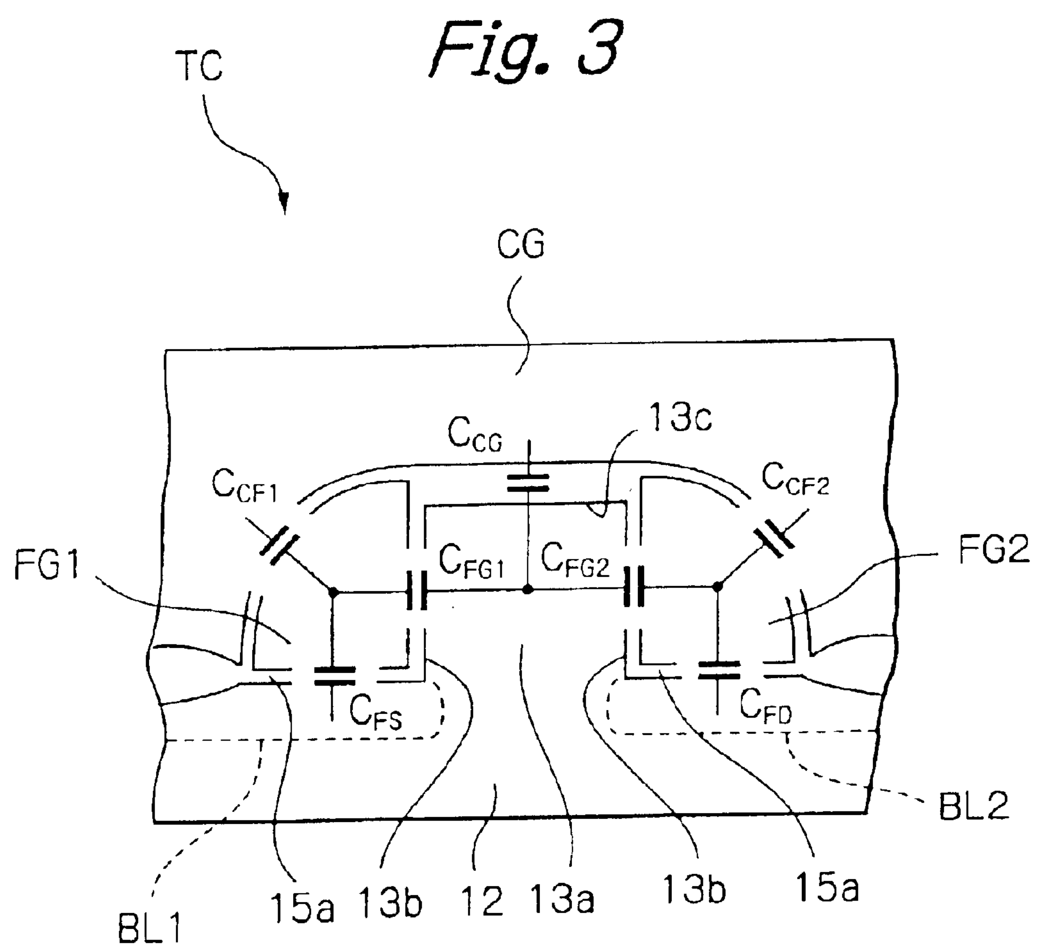
FIG. 3 shows an equivalent circuit representative of the cell transistor of FIG. 2.

FIG. 3 shows an equivalent circuit representative of the cell transistor TC and including various capacitance associated therewith. The capacitance is represented by a capacitor $C_{CG}$ between the control gate CG and the top 13*c* of the projection 13*c* facing each other, a capacitor $C_{CF1}$ ($C_{CF2}$) between the control gate CG and the floating ate FG1 (FG2) facing each other, a capacitor $C_{FG1}$ ($C_{FG2}$) between the floating gate FG1 (FG2) and the source/drain region BL1 (BL2) facing each other, and a capacitor $C_{FS}$ ($D_{FD}$) between the floating gate FG1 (FG2) and the source/drain region BL1 (BL2) facing each other.

Referring again to FIG. 1, a plurality of cell transistors TC are arranged side by side in both of the directions of column and row. The cell transistors TC adjoining each other in the direction column, e.g. cell transistors $TC_a$ and $TC_b$ share the source/drain regions BL3 and BL4, but are electrically isolated from each other by an isolation region 40. On the other hand, cell transistors $TC_c$ and $TC_a$, for example, adjoining each other in the direction of row share the control gate CG and share the source/drain region BL3 between them.

Figure 4:
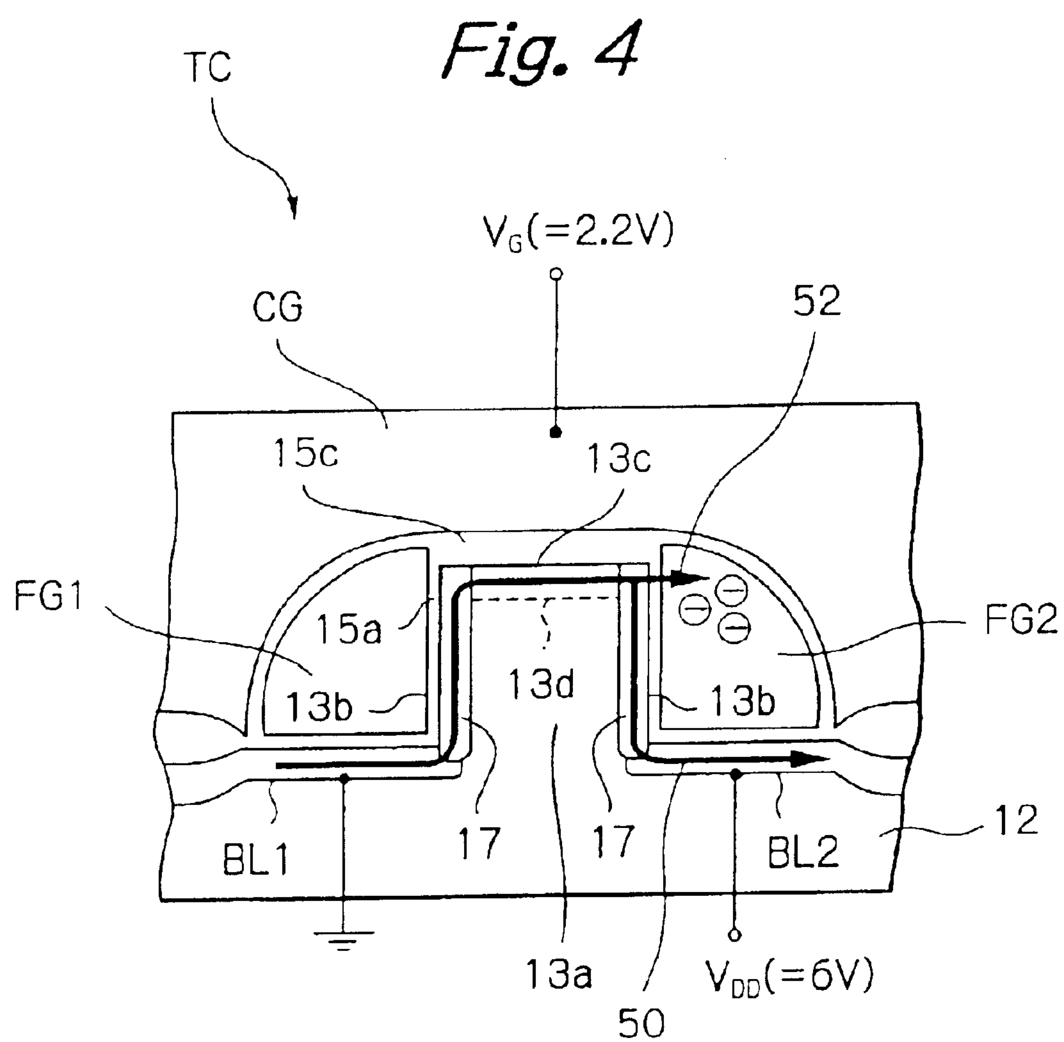
FIG. 4 shows a section demonstrating a write mode for writing data in the cell transistor of the illustrative embodiment.

A method of driving the individual cell transistor TC will be described hereinafter. First, reference will be made to FIG. 4 for describing how two-bit data is written into the cell transistor TC. In the illustrative embodiment, electrons can be selectively injected into either one of the floating gates FG1 and FG2, which are positioned at opposite sides of the projection 13*a*. As shown in FIG. 4, to inject electrons into the right floating gate FG2 in the figure byway of example, a gate voltage $V_G$ of, e.g. 2.2 V is applied to the control gate CG while a voltage $V_{DD}$ of e.g. 6 V, higher than the gate voltage, is applied to the source/drain region BL2 into which electrons should be injected. At the same time, the substrate 12 and the other source/drain region BL1 are grounded.

In the condition shown in FIG. 4, the positive potential applied to the control gate CG causes an inversion layer 13*d* to be formed in the surface of the top 13*c* of the projection 13*c*. The inversion layer 13*d* thus appearing causes the N type regions 17 to be electrically interconnected to each other. Because the N type regions 17 each are contiguous with one of the N type source/drain regions BL1 and BL2, the N type source/drain regions BL1 and BL2 themselves are electrically interconnected. Consequently, a carrier, electrons in the illustrative embodiment, flows through a path indicated by arrows 50 and 52.

Paying attention to electrons flowing along the top 13*c*, among others, the floating gate FG2 is positioned just at the right-hand side in the direction of the flow in the figure. Those electrons can therefore be injected straightforward into the floating gate FG2 without being steered as in the conventional structure. This allows the gate voltage (write voltage) $V_G$ for attracting the electrons toward the floating gate FG2 to be made lower than the conventional gate voltage. In addition, the floating gate FG2 is lowered in potential by the drain voltage through the gate insulation layer 15*a* having larger capacitance. That allows the gate voltage, or write voltage, $V_G$, for attracting the electrons towards the floating gate FG2, to be lowered to a further extent.

Further, the N type regions 17 formed on the side walls 13*b* of the projection 13*a* serve to lower the resistance of the side walls 13*b* for thereby obstructing voltage drop across the side walls 13*b*. Consequently, a higher voltage slightly lower than a voltage of, e.g. 6 V between the source/drain regions BL1 and BL2 is applied to the opposite ends of the top 13*c*, causing the top 13*c* to forcibly accelerate the electrons. As a result, the electrons are efficiently injected into the floating gate FG2, as indicated by the arrow 52 in FIG. 4. In this manner, the N type regions 17 also serve to lower the write voltage $V_G$. The N type regions 17 have the impurity concentration selected lower than that of the source/drain regions by the order of 1/100 through 1/10000, preferably 1/1000.

The above advantage is achievable even when the channel resistance at the top 13*c* is increased. The channel resistance can be increased if the thickness of the gate insulation layer 15*c* is increased to reduce the capacitance between the control gate CG and the channel region. In the illustrative embodiment, as shown in FIG. 4, the gate insulation layer 15*c* is made thicker than the tunnel insulation layers 15*a* for such a purpose.

Figure 5:
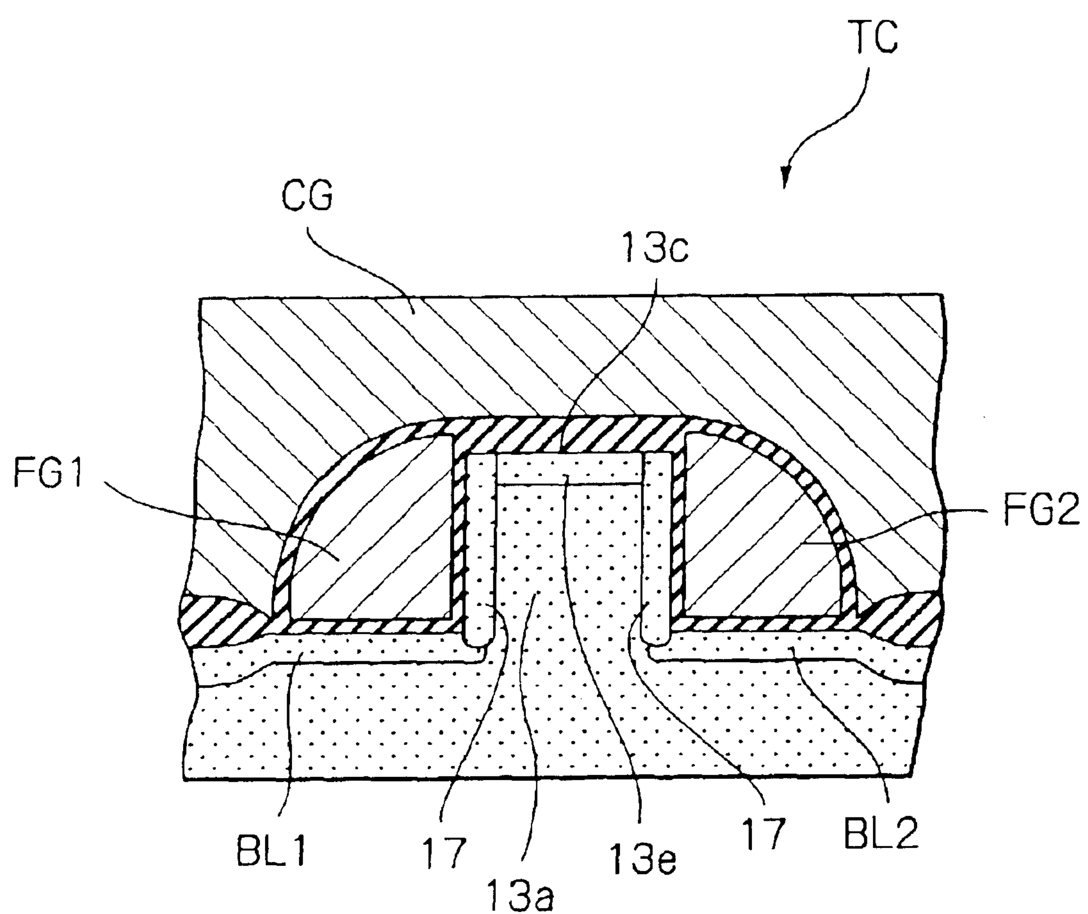
FIG. 5 shows a section of the cell transistor provided with a high-resistance region on the top of a projection.

FIG. 5 shows another specific structure for increasing the channel resistance at the top 13*c*. As shown, a high-resistance region 13*e*, which is a one-conductivity type of impurity-doped region, is formed on the top 13*c* of the projection 13*a*. To form the high-resistance region 13*e*, ions of a P type impurity are implanted in the top 13*c* to a higher concentration than that of the projection 13*a*.

When the channel resistance at the top 13*c* is increased, as shown in FIG. 4 or 5, the voltage drop at the top 13*c* increases with the result that a higher voltage slightly lower than the voltage between the source/drain regions BL1 and BL2 is applied to the opposite ends of the top 13*c*. Consequently, there can be lowered the write voltage $V_G$ for the same reason as stated above.

As stated above, the write voltage $V_G$ can be lowered i) if the N type regions are formed on the side walls 13*b*, ii) if the tunnel insulation layer has an increased capacitance to raise the floating gate in potential with the drain voltage, iii) if the thickness of the gate insulation layer 15*c* is increased, or iv) if the high-resistance region 13*e* is formed on the top 13*c*. These different schemes i) through iv) may be suitably combined, if desired, to attain the intended advantages described above. In any case, the write voltage $V_G$ should only be about 2.2 V, which is far lower than the conventional write voltage of about 12 V to 13 V.

Figure 6A:
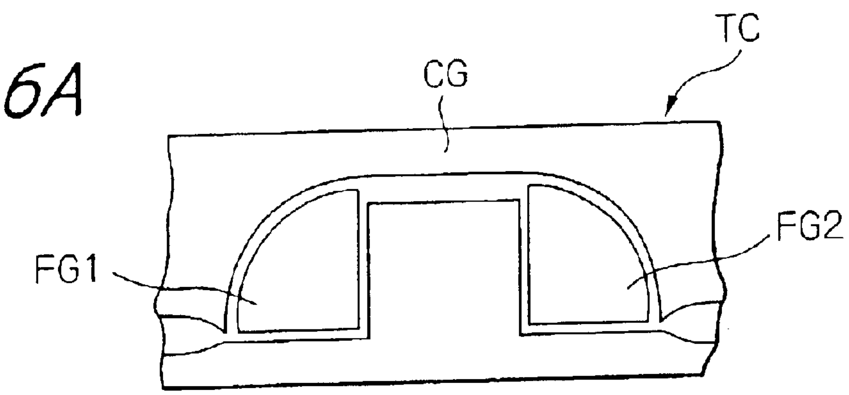
FIGS. 6A through 6D are sections showing four different states achievable with the cell transistor of the illustrative embodiment.
Figure 6B:
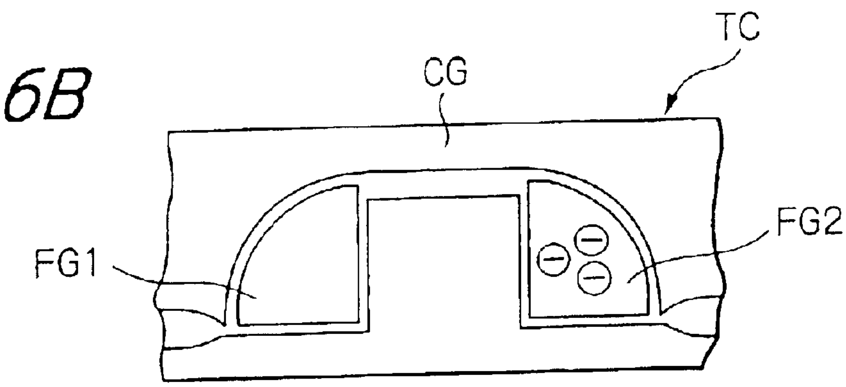
Figure 6C:
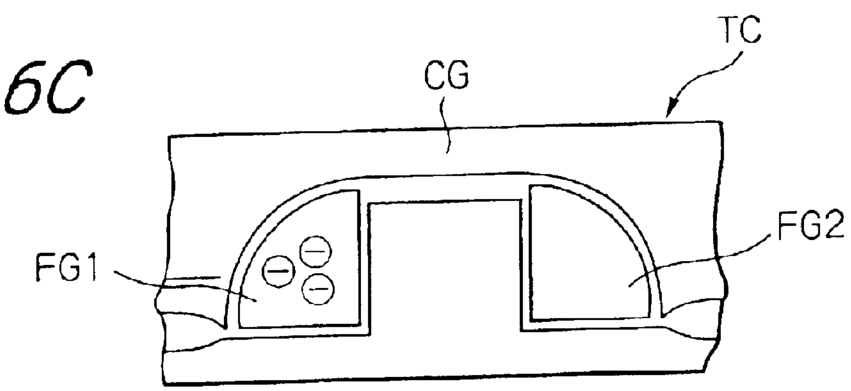
Figure 6D:
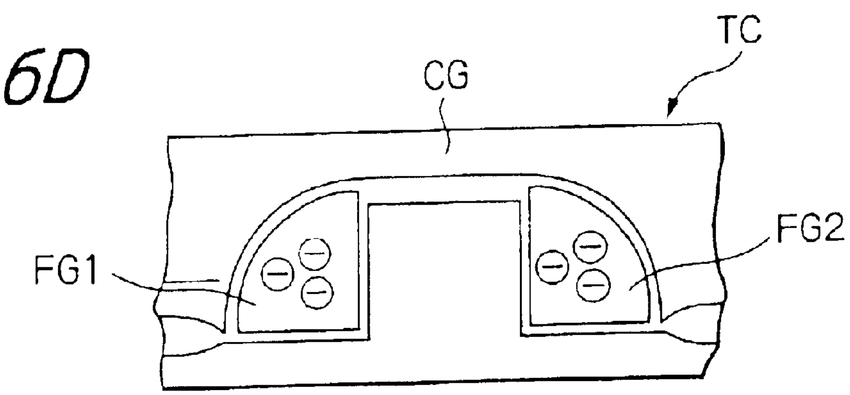

With the example shown in FIG. 4, electrons are injected into the right floating gate FG2. Into the left floating gate FG1, however, electrons can be injected only if the voltages applied to the source/drain regions BL1 and BL2 are replaced with each other from the FIG. 4 example. The illustrative embodiment therefore implements four different states shown in FIGS. 6A through 6D. FIG. 6A shows a stored-bit state (1, 1) in which electrons are not injected into either one of the floating gates FG1 and FG2. FIGS. 6A and 6B respectively show storage states (1, 0) and (0, 1) in each of which electrons are injected into either one of the floating gates FG1 and FG2. FIG. 6D shows a state (0, 0) in which electrons are injected into both of the floating gates FG1 and FG2; for example, electrons may be injected into the right floating gate FG2 and then injected into the left floating gate FG1. In this manner, the illustrative embodiment allows two bits of data (1, 1) through (0, 0) to be selectively written to a single cell transistor TC.

The illustrative embodiment includes two floating gates FG1 and FG2 and allows electrons to exist in the gates FG1 and FG2 separately from each other, as stated above. Therefore, even in an application in which the cell size is reduced, it is definitely distinguishable which of the floating gates FG1 and FG2 includes significant electrons, compared to the prior art structure.

Figure 7A:
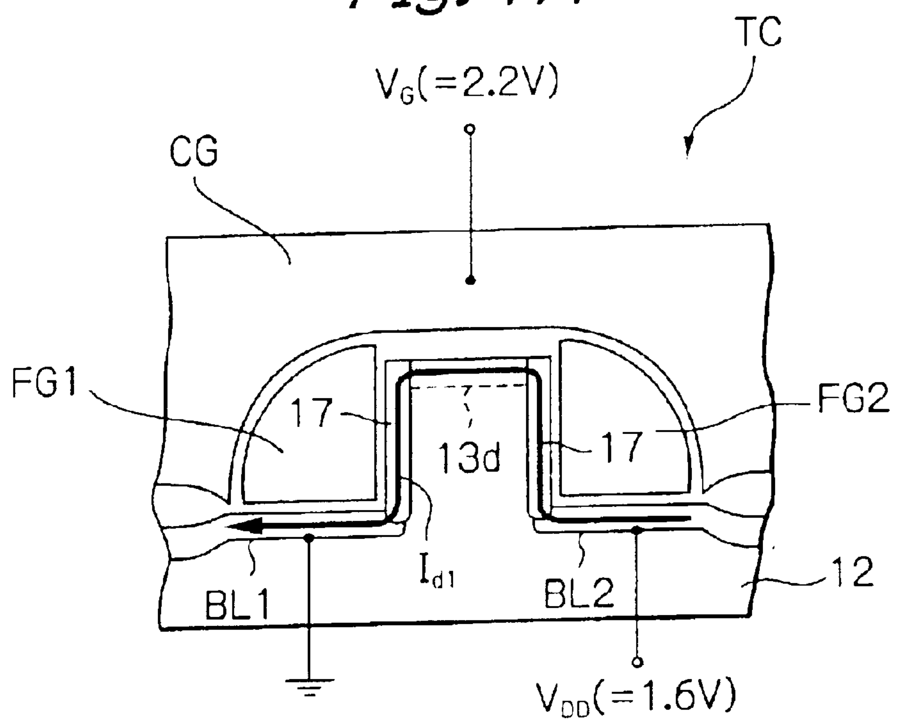
FIGS. 7A and 7B show sections in a read mode for reading out data from the cell transistor of the illustrative embodiment.
Figure 7B:
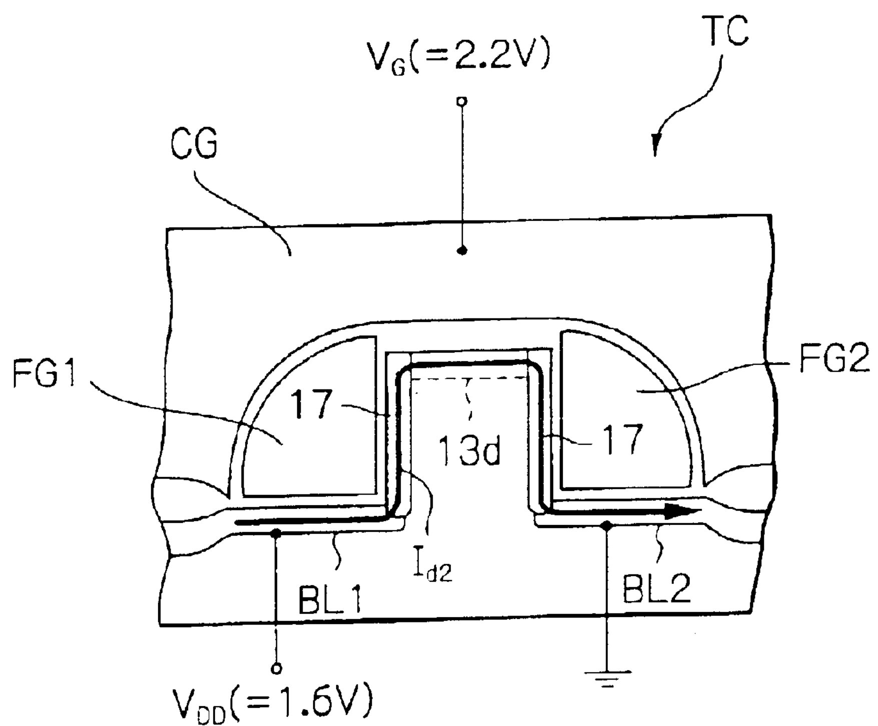

Reference will be made to FIGS. 7A and 7B for describing how two-bit data are read out from the individual cell transistor TC. First, as shown in FIG. 7A, the gate voltage $V_G$ of, e.g. 2.2 V is applied to the control gate CG. Subsequently, the voltage $V_{DD}$ of, e.g. 1.6 V is applied to one source/drain region BL2 while the other source/drain region BL1 and substrate 12 are connected to ground, i.e. a reference potential. In the resulting potential distribution, the potential of the control gate CG is positive with the result that the inversion layer 13$d$ is formed on the top 13$c$ of the projection 13. As a result, a drain current $I_{d1}$ flows in a direction indicated by an arrow in FIG. 7A.

Subsequently, as shown in FIG. 7B, the voltages applied to the source/drain regions BL1 and BL2 are replaced with each other with the gate voltage $V_G$ of 2.2 V being maintained the same. As a result, the potential difference between the source/drain regions BL1 and BL2 is inverted, causing a drain current $I_{d2}$ to flow in a direction indicated by an arrow in FIG. 7B.

In the illustrative embodiments, the drain currents $I_{d1}$ and $I_{d2}$ are measured which flow one after the other due to the replacement of the voltages applied to the source/drain regions BL1 and BL2. The values of the drain currents $I_{d1}$ and $I_{d2}$ are different in accordance with the states, as will be described specifically later. It is therefore possible to compare the current sets ($I_{d1}$, $I_{d2}$) with the states one-to-one to determine which of the states the cell is. Drain currents to flow at the different states (1, 1) through (0, 0) will be described in detail hereinafter.

Figure 8A:
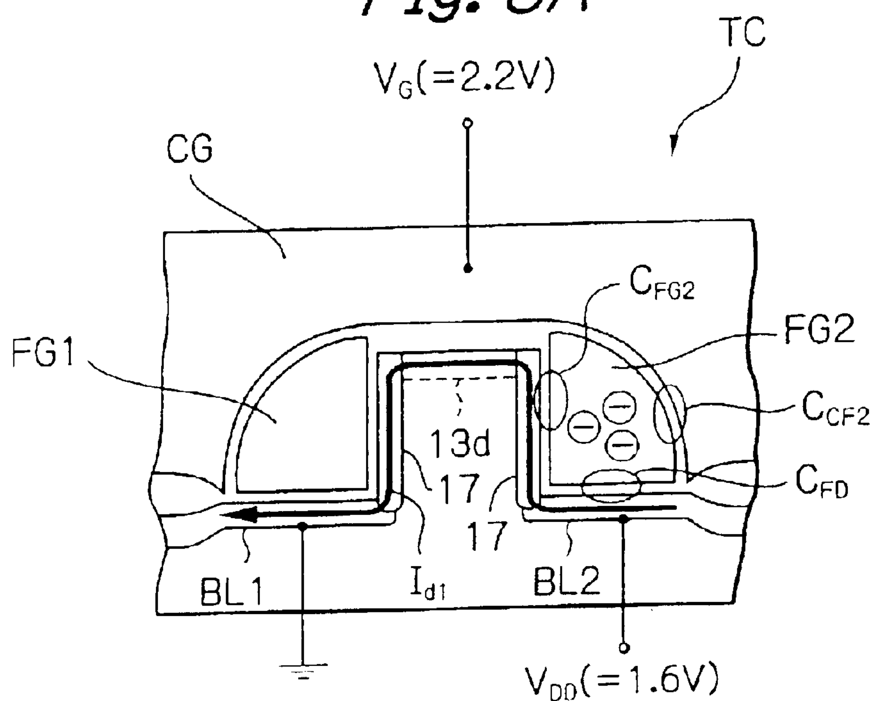
FIGS. 8A and 8B show sections useful for understanding how a state (1, 0) is sensed from the cell transistor of the illustrative embodiment.
Figure 8B:
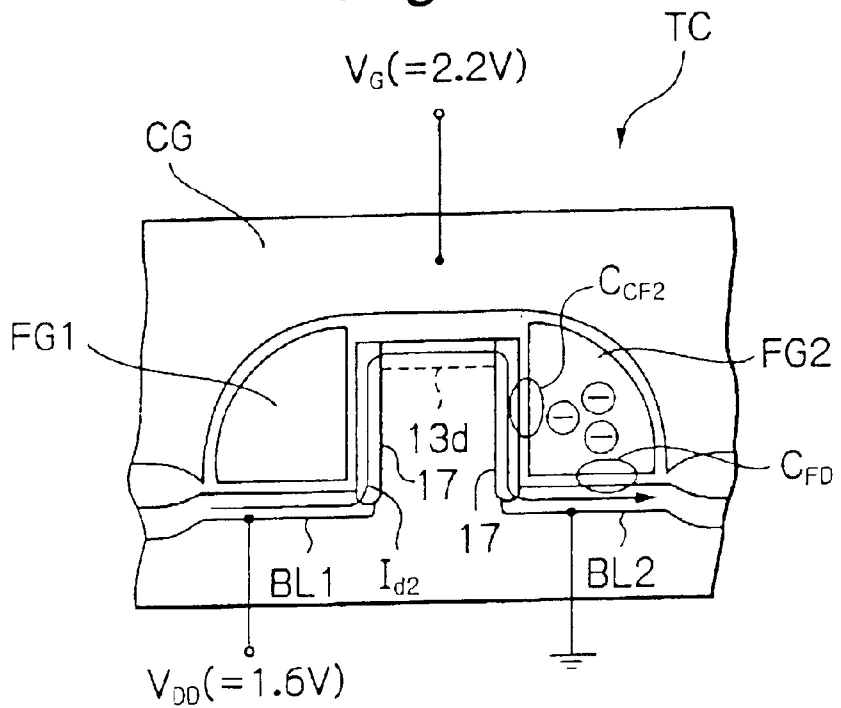

FIGS. 8A and 8B demonstrate how the state (1, 0) is sensed from the cell transistor TC. As shown in FIG. 8A, voltages are applied to the structural members of the cell transistor TC in the same manner as in FIG. 7A, causing the drain current $I_{d1}$ to flow. In this condition, although the potential of the right flowing gate FG2 is lowered due to electron injection, it is raised by the capacities $C_{CF2}$ and $C_{FD}$ toward the positive potential of the control gate CG (2.2 V) and that of the source/drain BL2 (1.6 V). Consequently, the potential drop of the floating gate FG2 is limited, so that channel resistance around the gate FG2 is not so high. The drain current $I_{d1}$ therefore has a relatively great value.

Particularly, the N type region 17 contacting the source/drain region BL2 has a potential substantially equal to the potential of the source/drain region BL2. The potential of the floating gate FG2 is therefore raised toward the source/drain BL side by the capacitance $C_{FG2}$ as well, further lowering channel resistance around the gate FG2. As a result, the value of the drain current $I_{d1}$ further increases.

Subsequently, as shown in FIG. 8B, the voltages applied to the source/drain regions BL1 and BL2 are replaced with each other to cause the drain current $I_{d2}$ to flow. In this case, the potential of the right floating gate FG2 is lowered due to electron injection. Further, because the right source/drain region BL2 is connected to the ground, the potential of the floating gate FG2 is lowered toward the ground through the capacitance $C_{FD}$ between the gate FG2 and the region BL2. Consequently, the potential of the floating gate FG2 is lower in FIG. 8B than in FIG. 8A and causes channel resistance around the gate FG2 to increase. The drain current $I_{d2}$ is therefore smaller than the previous drain current $I_{d1}$.

Particularly, the N type region 17 causes the potential of the right floating gate FG2 to be lowered toward the ground side by the capacitance $C_{FG2}$ as well, so that the value of the drain current $I_{d2}$ is further reduced. As stated above, the state (1, 0) can be identified on the basis of ($I_{d1}$, $I_{d2}$)=(large, small). To identify greater one of the drain currents $I_{d1}$ and $I_{d2}$, a sense amplifier associated with the memory circuit, not shown, compares each of them with a reference current.

In the illustrative embodiment, the values of the drain currents $I_{d1}$ and $I_{d2}$ can be increased or decreased on the basis of the capacitance $C_{CF2}$, $C_{FD}$ and $C_{FG2}$, as desired. This allows the difference ($I_{d1}-I_{d2}$) to be increased to a desired value Stated another way, the illustrative embodiment allows the current window represented by the above difference to be broadened, as desired. A wide current window increases the margins of the drain currents $I_{d1}$ and $I_{d2}$ and reference current, thereby reducing the probability of incorrect identification of written data.

To sense the state (0, 1) from the cell transistor TC, electrons are injected into the left floating gate FG1 opposite to the right floating gate FG2. Therefore, the drain currents $I_{d1}$ and $I_{d2}$ are estimated in the same manner as in the above description, so that there holds ($I_{d1}$, $I_{d2}$)=(small, large).

As for the state (1, 1) to be sensed from the cell transistor TC, electrons are not injected into either one of the floating gates FG1 and FG2. In this case, the drain currents $I_{d1}$ and $I_{d2}$ both are great because the potential of the floating gate FG1 or that of the floating gate FG2 is not lowered by the electrons. This condition is symmetrical in the right-and-left direction, i.e. the drain currents $I_{d1}$ and $I_{d2}$ are not different from each other; ($I_{d1}$, $I_{d2}$)=(large, large) holds.

Further, as for the state (0, 0), symmetry is set up in the right-and-left direction because electrons are injected into both of the floating gates FG1 and FG2. Therefore, ($I_{d1}$, $I_{d2}$)=(small, small) holds, meaning that the drain currents $I_{d1}$ and $I_{d2}$ are not different from each other.

Figure 9:
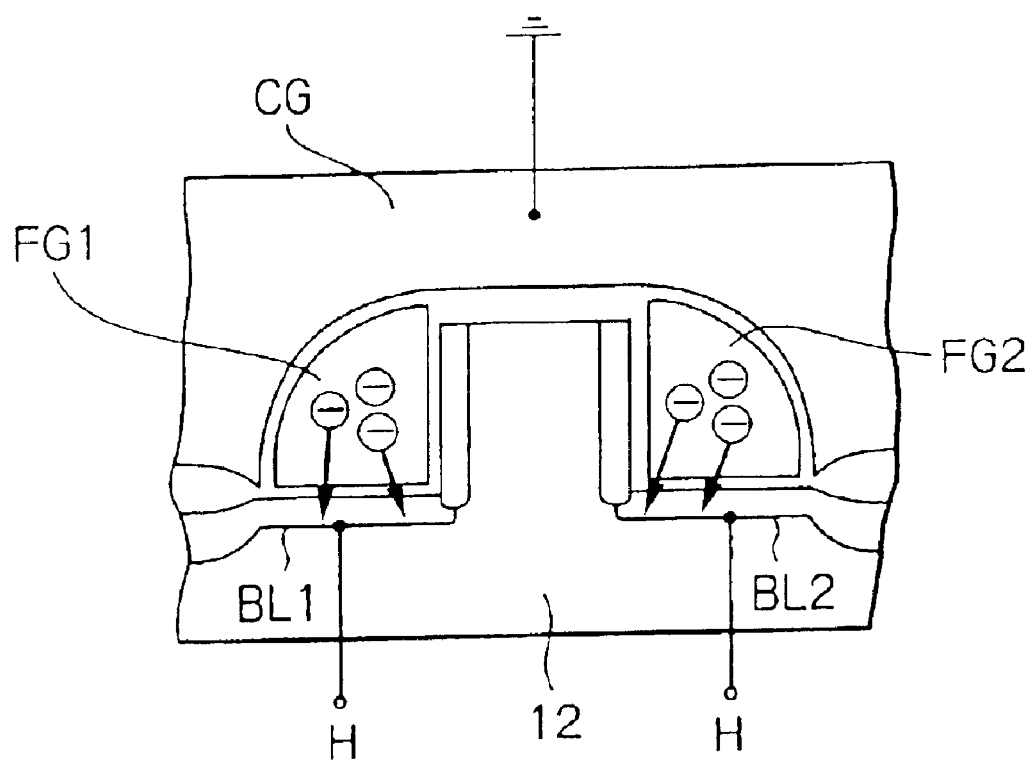
FIG. 9 shows a section useful for understanding a specific method of discharging electrons implanted in floating gates that form part of the cell transistor.

Specific methods of discharging the electrons, i.e. deleting the data stored, injected in the floating gates FG1 and FG2 available with the illustrative embodiment will be described hereinafter. FIG. 9 shows a specific method that withdraws electrons from the floating gates FG1 and FG2 into the source/drain regions BL1 and BL2, respectively. This method is practicable by connecting the control gate CG to ground and applying a high potential "H" (e.g. 12 V) to each of the source/drain regions BL1 and BL2. In this regard, the potential difference may be set up relatively between the control gate CG and the source/drain regions BL1 and BL2. For example, the control gate CG and the source/drain regions BL1 and BL2 may be supplied with a voltage of −6 V and +6 V, respectively.

Figure 10:
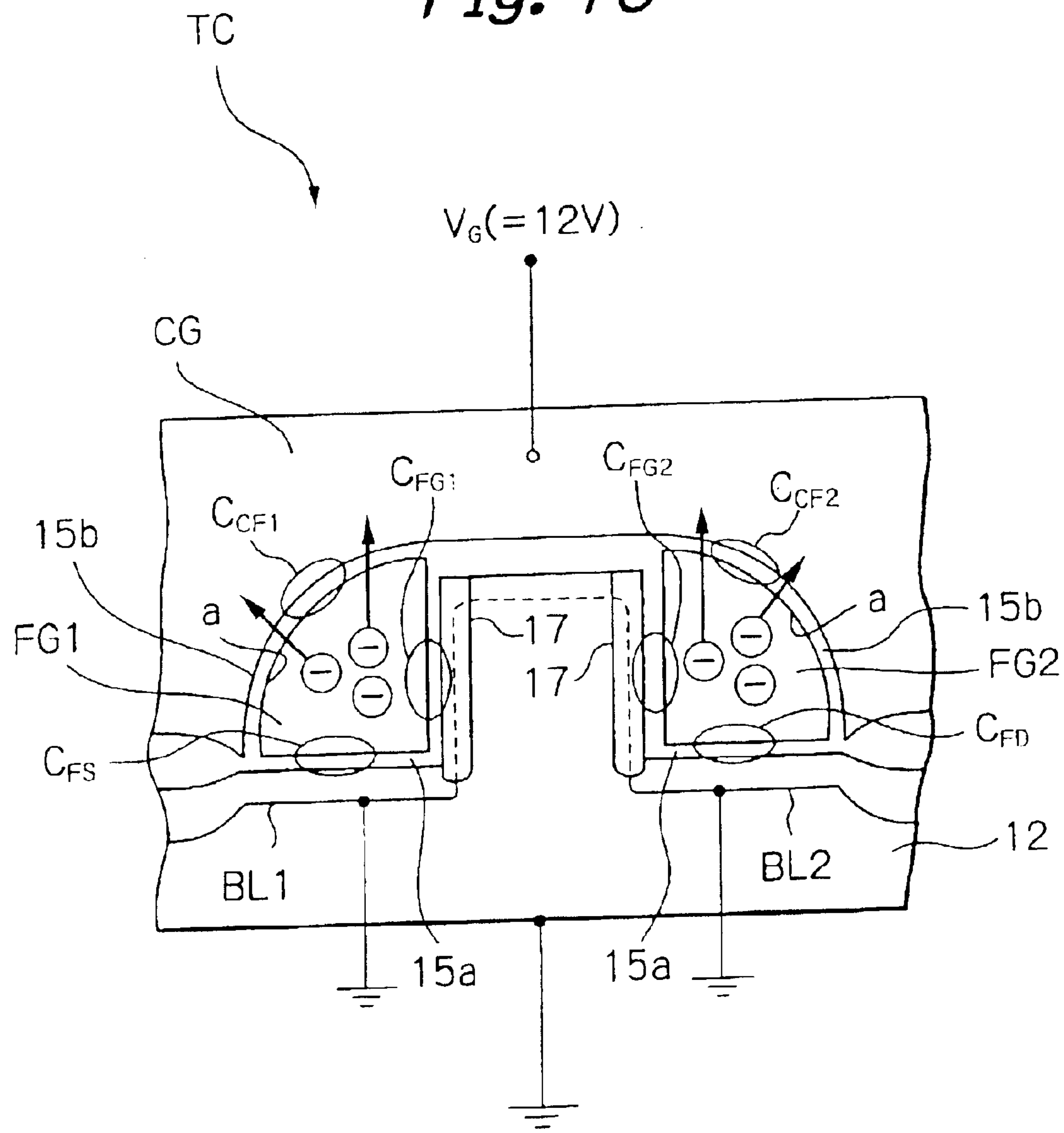
FIG. 10 shows a section useful for understanding another specific method of discharging electrons implanted in the floating gates.

FIG. 10 shows another specific method that applies a high potential VG (e.g. 12 V) to the control gate CG and connects the substrate 12 and source/drain regions BL1 and BL2 to ground. In this potential distribution, electrons are withdrawn from the floating gates FG1 and FG2 into the control gate CG because the potential of the control gate CG is higher than the potentials of the gates FG1 and FG2. In this regard also, the control gate CG and the source/drain regions BL1 and BL2 may be supplied with a voltage of +6 V and −6 V, respectively.

The writing, reading and deleting operations of the illustrative embodiment have been shown and described on the assumption that the cell transistor 1 is selected in the memory cell array. In practice, however, the cell transistor 1 is sometimes not selected. Even when the cell transistor 1 is not selected, the drive voltage $V_{DD}$ is applied to the bit line BL1, see FIG. 3, in order to select another other cell transistor TC. In this case, the potential of the floating gate FG1 of the unselected cell transistor TC is pulled toward the potential of the bit line BL1 due to a great capacitance $C_{FS}$ between the gate FG1 and the bit line BL1. As a result, the potential difference between the floating gate FG1 and the source/drain region BL1 decreases, so that the tunnel insulation layer 15*a* between the gate FG1 and the region BL1 is prevented from being exposed to the strong electric field. Consequently, a tunnel current that would deteriorate the tunnel insulation layer 15*a* is successfully prevented from flowing through the layer 15*a*.

It is noteworthy that the capacitance $C_{FS}$ ($C_{FD}$) between the floating gate FG1 (FG2) and the source/drain region BL1 (BL2) plays an important role in achieving the advantages described in relation to write-in, read-out and deletion as well as the unselected condition. In the illustrative embodiment, the floating gate FG1 (FG2) is positioned above the source/drain region BL1 (BL2) in order to reduce the distance between the floating gates FG1 and FG2, thereby reducing the device size and increasing the capacities $C_{FD}$ and $C_{FS}$.

Figure 28:
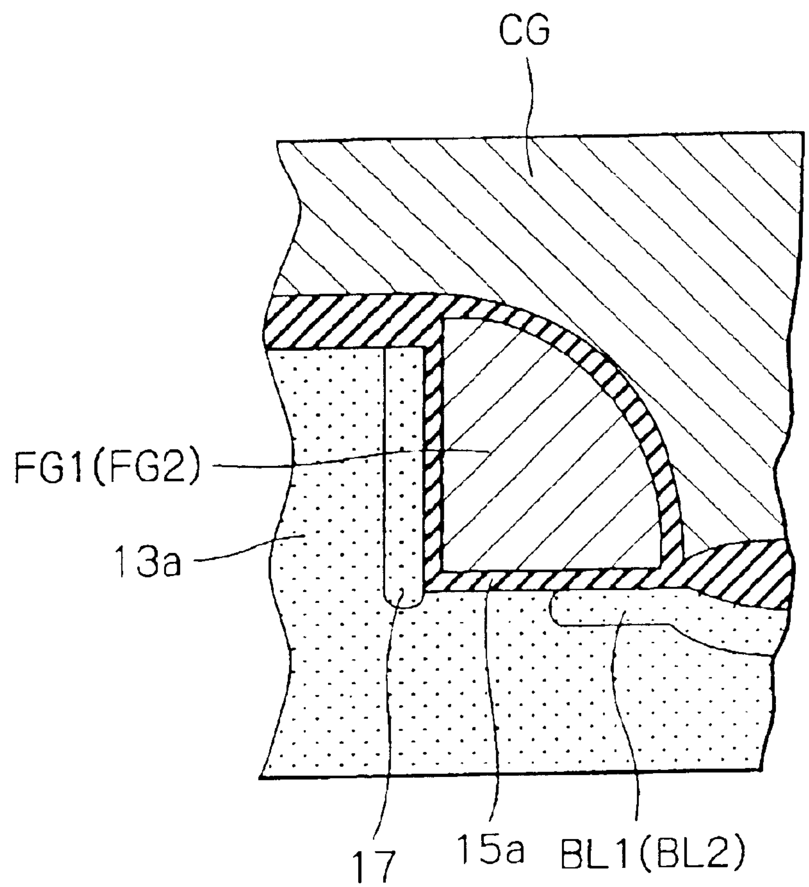
FIG. 28 is a cross-sectional view showing another specific configuration of a source/drain region available with the illustrative embodiment.
Figure 29:
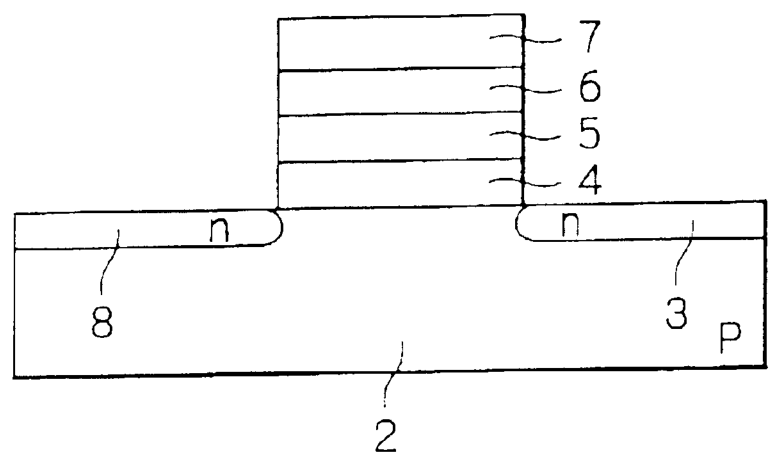
FIG. 29 shows a section of a prior art, multiple-bit cell transistor.
Figure 30A:
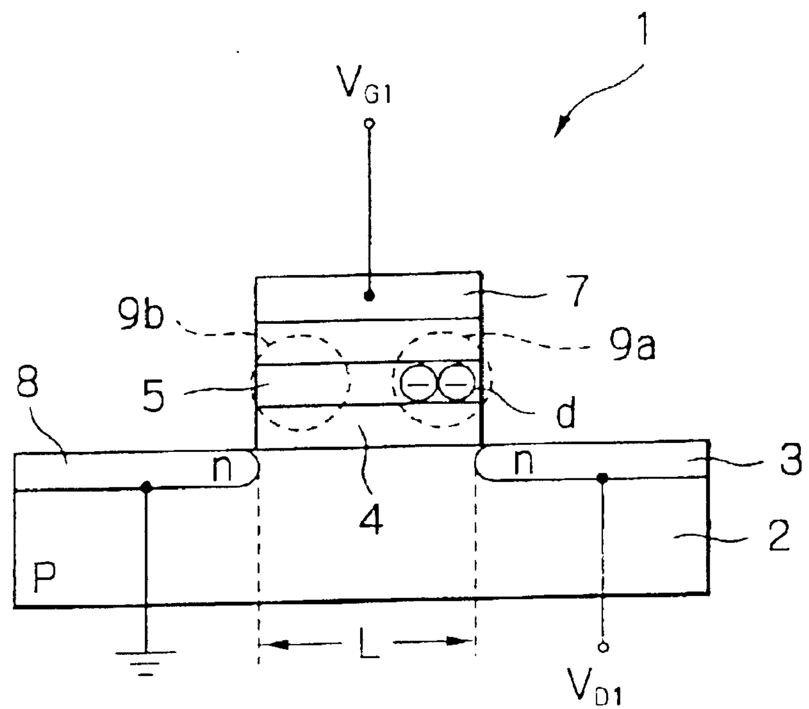
FIGS. 30A and 30B show sections useful for understanding a procedure for writing data in the prior art cell transistor.
Figure 30B:
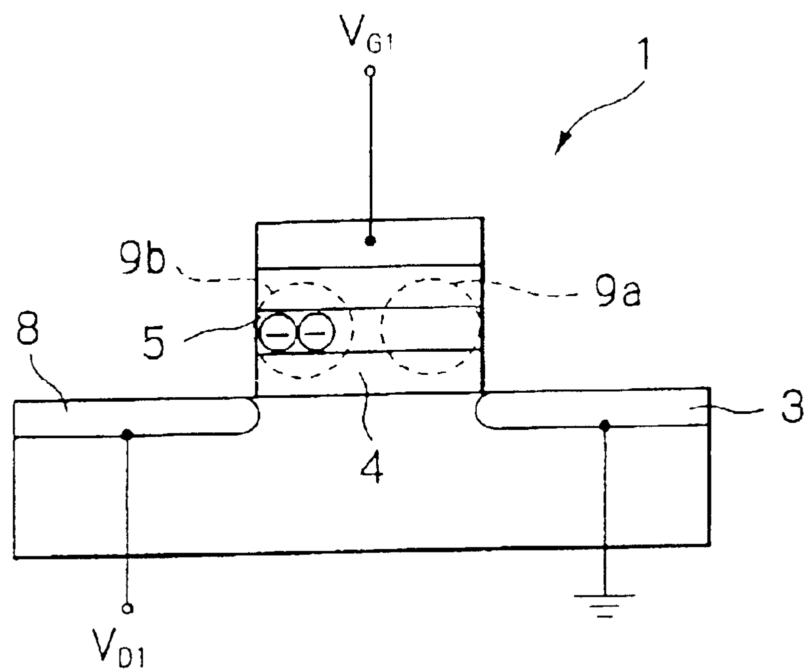
Figure 31A:
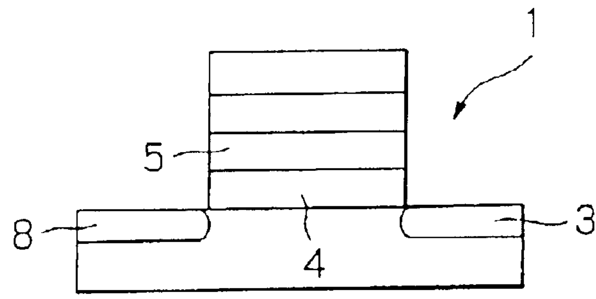
FIGS. 31A through 31D show sections representative of four different storage states particular to the prior art cell transistor.
Figure 31B:
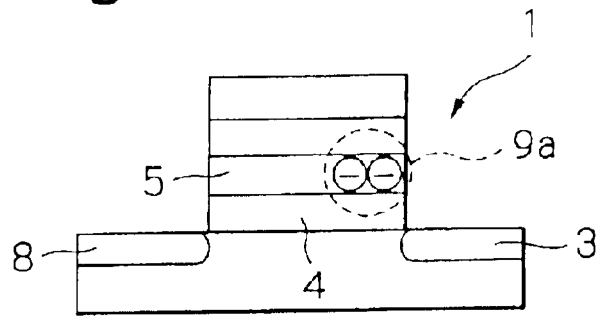
Figure 31C:
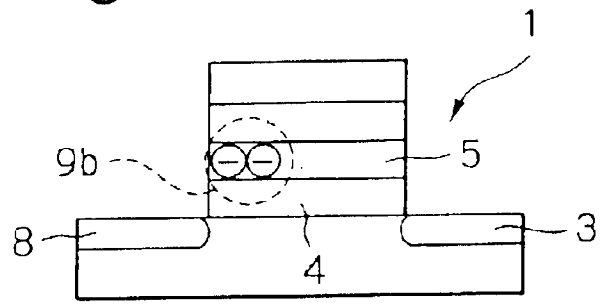
Figure 31D:
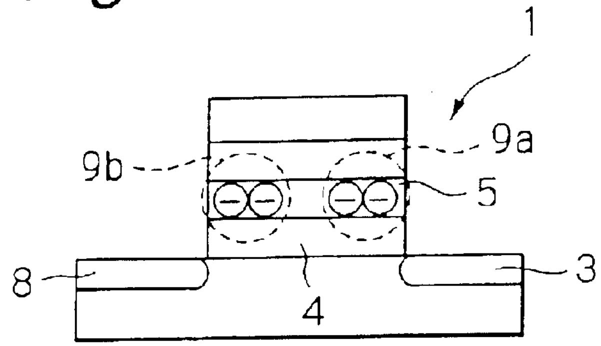
Figure 32:
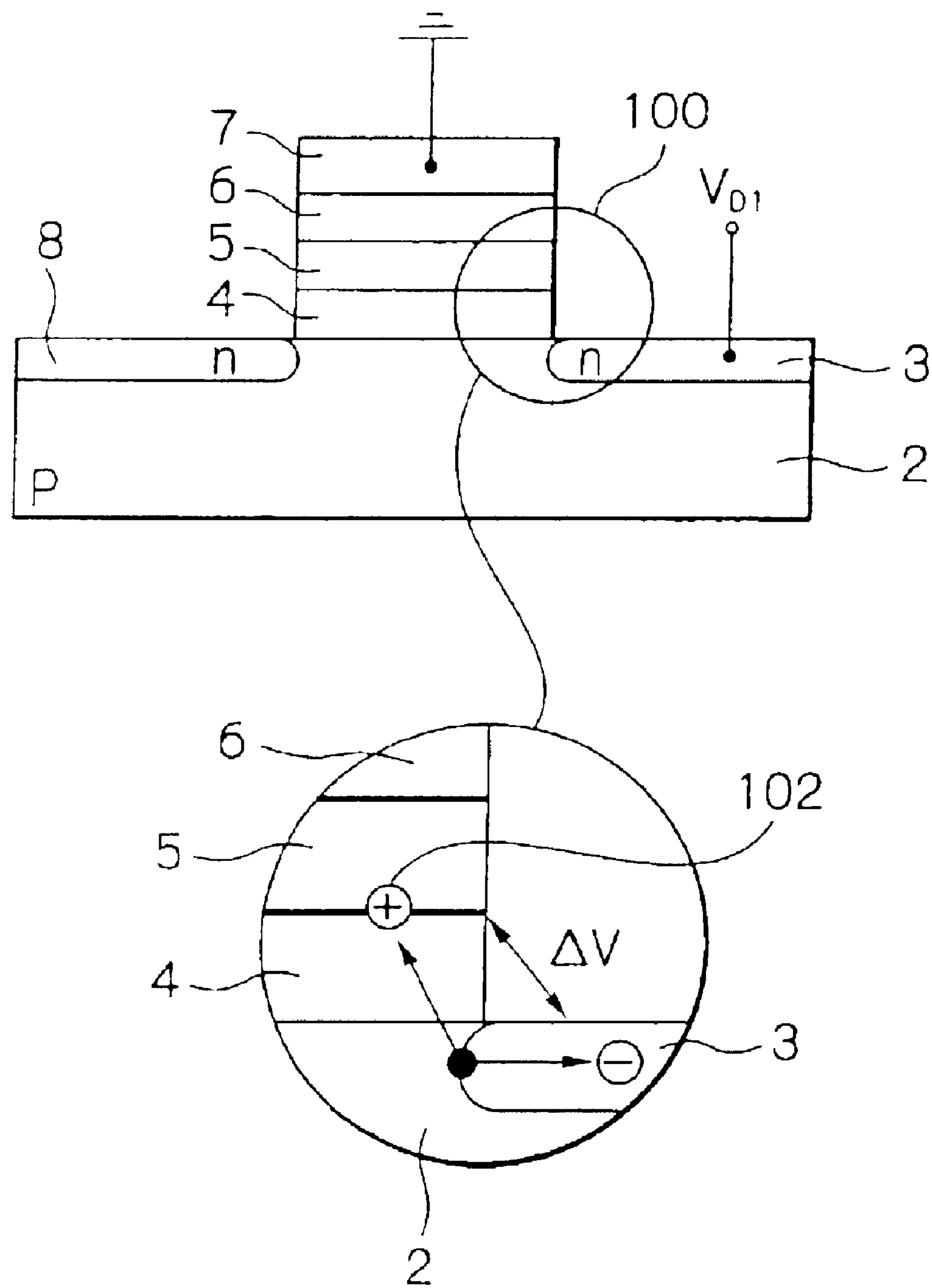
FIG. 32 shows a section useful for understanding why the prior art cell transistor is short of resistance to inter-band tunneling, together with an enlarged view of a portion thereof.

The area over which the floating gate FG1 (FG2) and source/drain region BL1 (BL2) face each other is open to choice. While the advantages described above are easier to achieve as the above area becomes larger, they are achievable even if the area is small. FIG. 28 shows another specific configuration in which the source/drain region BL1 (BL2) is set back from the projection 13*a*, causing part of the source/drain region BL1 (BL2) to face the floating gate FG1 (FG2). The advantages are achievable with such a configuration as well for the reason described above.

The illustrative embodiment copes with punch-through and stabilizes the threshold voltage $V_{th}$ with the following implementations. When punch-through between the source/drain regions BL1 and BL2 is likely to occur, it is preferable to use a specific structure shown in FIG. 11. A graph shown in FIG. 11 together with the specific structure plots the concentration of boron, actin gas a P type impurity, with respect to depth in the projection 13*a*. As shown, the boron concentration of the projection 13*a* sequentially increases in the direction of depth up to the root portion of the projection 13*a*. The boron concentration is therefore high on the portions of the side walls 13*b* adjoining the source/drain regions BL1 and BL2.

The above-described structure is featured with the concentration of the P type impurity higher in the part of an expected channel closer to the N type source/drain regions BL1 and BL2. The channel will therefore be established apart from the straight line connecting the N type source/drain regions BL1 and BL2. In other words, the channel will be formed in the side wall surfaces 13*b* and the top surface 13*c* of the projection 13*a*. That also implies in the structure shown in FIG. 11 that the concentration of the P type impurity higher in the portions of the channel closer to the N type source/drain regions BL1 and BL2 obviates punch-through between the source/drain regions BL1 and BL2. A higher packing density will be accomplished with a semiconductor memory device integrating the cell transistors in the form of integrated circuit.

The threshold voltage $V_{th}$ of the cell transistor TC is noticeably susceptible to the impurity concentration on the portions of the side walls 13*b* close to the root portion of the projection 13*a*. It follows that the high boron concentration at the root portion of the projection 13*a* results in a high threshold voltage $V_{th}$. However, the N type impurity of the N type regions 17 formed on the side walls 13*b* and the P type impurity of the side walls 13*b* compensate each other, so that the substantial acceptor concentration of the side walls 13*b* can be lowered. Therefore, even if the boron concentration is increased in the root portion of the projection 13*a*, the N type regions 17 surely prevent the threshold voltage $V_{th}$ from rising to an excessive degree.

Because the threshold voltage $V_{th}$ is susceptible to the impurity concentration of the root portion of the projection 13*a*, as stated above, the impurity concentration of the root portion should preferably be prevented from noticeably varying in order to stabilize the threshold voltage $V_{th}$. For this purpose, it is preferable not only to increase the boron concentration of the projection 13*a* little by little, but also to make a peak thereof as flat as possible, as indicated by bold part of the curve shown in FIG. 11. In such a flat portion, the boron concentration varies little, so that a relation between the boron concentration and the arsenic concentration of the N type regions 17 remains substantially constant. This is successful to maintain the threshold voltage $V_{th}$ stable.

Figure 12:
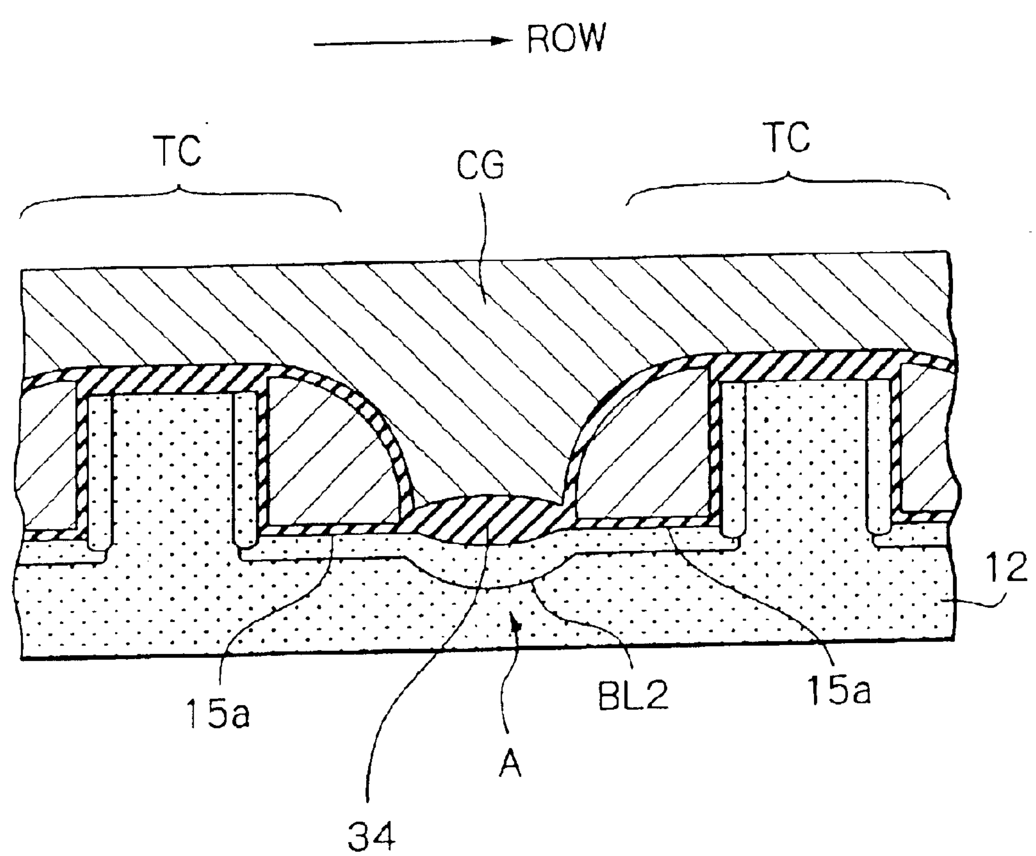
FIG. 12 is a cross-sectional view showing a selective oxide layer connecting tunnel insulation layers included in the cell transistor of the illustrative embodiment.

As shown in FIG. 12, in the illustrative embodiment, the control gate CG and bit line BL2 face each other at a portion A between the cell transistors TC adjoining each other in the direction of row. In this configuration, a leak current may flow between the control gate CG and the bit line BL2 in any one of the operation modes stated earlier. In light of this, it is preferable to form a selective oxide layer or fourth insulation layer 34 contiguous with the tunnel insulation layers 15*a* and to make the selective oxide layer 34 thicker than the tunnel insulation layers 15*a*. The selective oxide layer 34 with such thickness obviates the above leak current. With the example shown in FIG. 12, in order to prevent a leak current from flowing between the control gate CG and the bit lines BL1 and BL2, the fourth insulation layer is established by selective oxidization. This does not restrict the invention. Alternatively, an opening may be cut between the floating gates adjacent each other, and filled with an oxide, over which the control gate CG is formed.

In addition, the insulator 34 buried between the control gate CG and the bit lines BL1 and BL2 in this manner allows only the portions of the floating gates FG1 and FG2 contacting the inter-polycrystalline insulation layer 15*b* to face the control gate CG.

Referring again to FIG. 1, although only several cell transistors TC are shown, numerous cell transistors are, in practice, arranged in an actual device. The bit lines BL1 through BL4 each become longer in the direction of column as the number of cell transistors TC fabricated increases, so that the resistance of the bit lines BL1 through BL4 is not negligible. It is therefore preferable to lower the resistance of the bit lines BL1 through BL4 as far as possible.

The illustrative embodiment provides each of the bit lines BL1 through BL4 with an N+ type region 33, which is a higher-concentration, counter-conductivity type region, to lower the resistance of those bit lines. While each N+ type region 33 is visible in FIG. 1 only in a section, it extends in parallel to the associated one of the bit lines BL1 through BL4. The N+ type regions 33 serve to lower the resistance of the bit lines BL1 through BL4 for thereby preventing the operation speed of a device from noticeably dropping.

Figure 13:
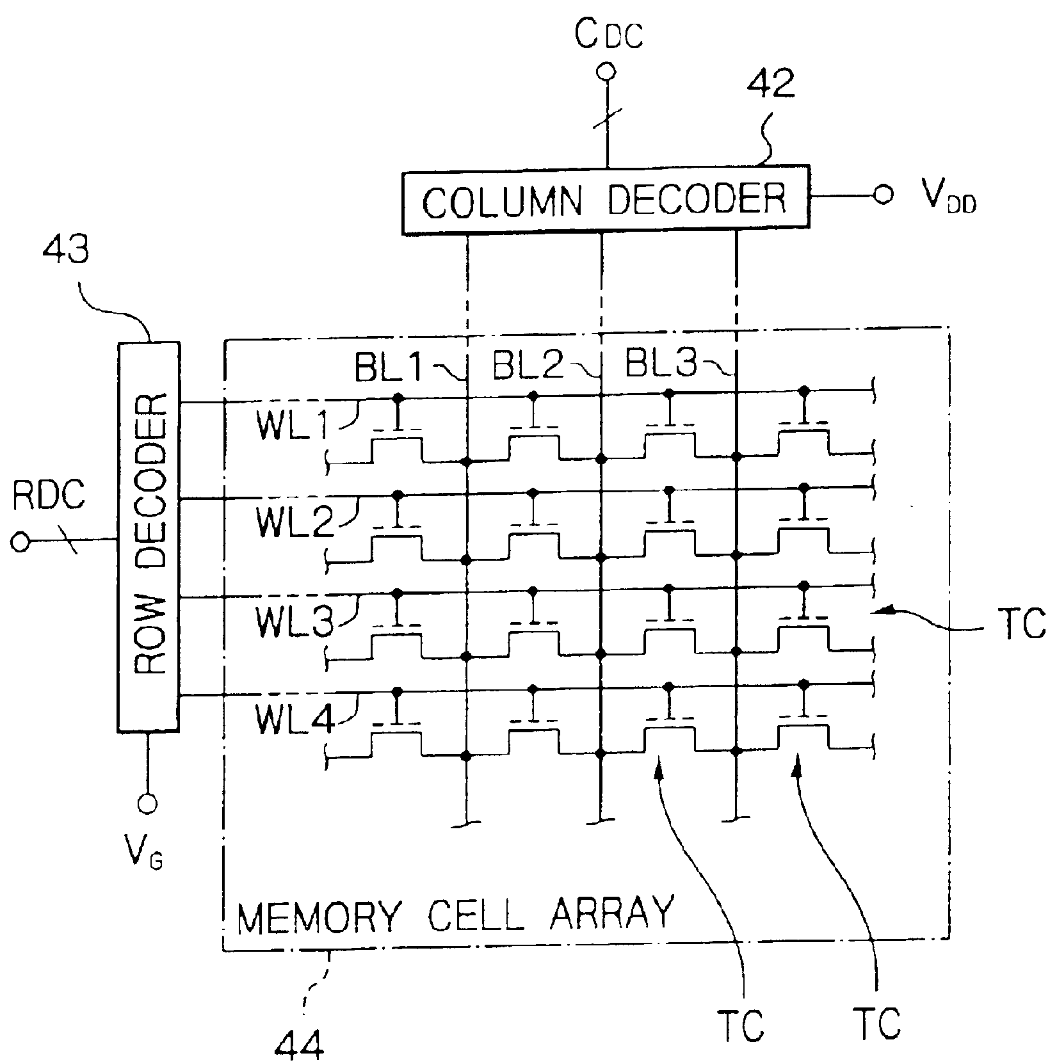
FIG. 13 is a block diagram schematically showing the general configuration of the semiconductor memory of the illustrative embodiment.

Reference will be made to FIG. 13 for describing the general circuit arrangement of the illustrative embodiment. As shown, a memory cell array 44 includes cell transistors TC arranged in rows and columns. Control gates WL1 through WL4, which function as word lines in the circuitry, each being shared by a particular row of cell transistors TC are connected to the output of a row decoder 43. The row decoder 43 decodes a low decode signal RDC having a preselected number of bits to thereby select one of the word lines WL1 through WL4 corresponding to the signal RDC. A gate voltage $V_G$ is applied to one of the word lines WL1 through WL4 selected. The gate voltage $V_G$ is switched in accordance with the operation mode; a write mode, a read mode or a delete mode. More specifically, the gate voltage $V_G$ is 2.2 V in the write and read modes or 12 V in the delete mode, as stated earlier. The word lines WL1 through WL4 may, when not selected, be brought into the floating state thereof.

The bit lines BL1, BL2 and BL3 associated with the cell transistors TC are connected to the output of a column decoder 42. The column decoder 42 decodes a column decode signal CDC having a preselected number of bits to thereby select one of the bit lines BL1 through BL3 corresponding to the signal CDC. A voltage $V_{DD}$ is fed to one of the bit lines BL1, BL2 and BL3 selected. The voltage $V_{DD}$ is switched in accordance with the operation mode; the write mode, the read mode or the delete mode. More specifically, the voltage $V_{DD}$ is the ground or reference voltage or 6 V in the write mode, the ground voltage or 1.6 V in the read mode or the ground voltage in the delete mode, as stated earlier. The bit lines BL1, BL2 and BL3 may, when not selected, be brought into the floating state thereof.

The cell transistors TC each are selected by a bit line BLi selected and a word line WLj selected in any one of the write mode, read mode, and delete mode, where i and j are natural numbers.

Figure 14A:
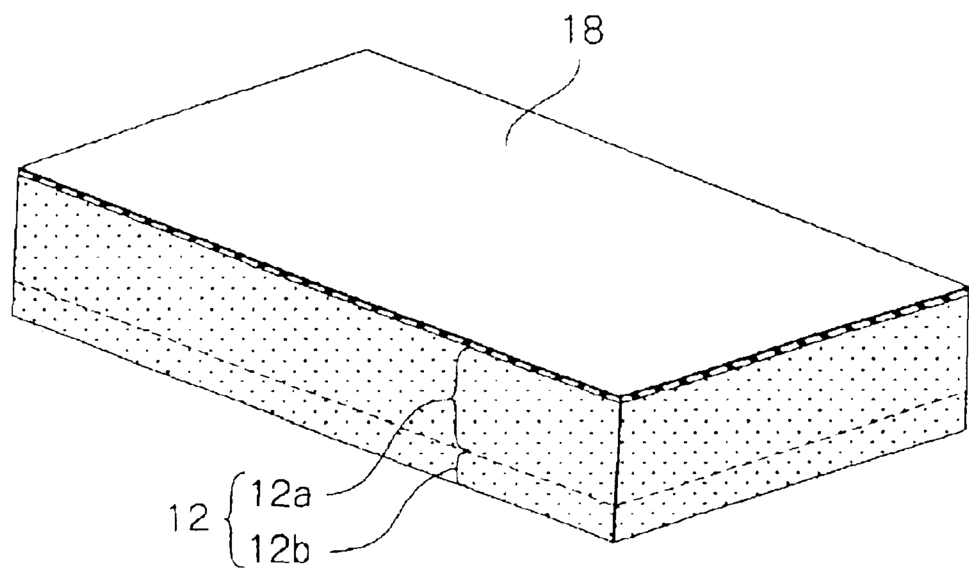
FIGS. 14A through 25 are fragmentary perspective views demonstrating a series of steps of manufacturing the semiconductor memory of the illustrative embodiment.
Figure 14B:
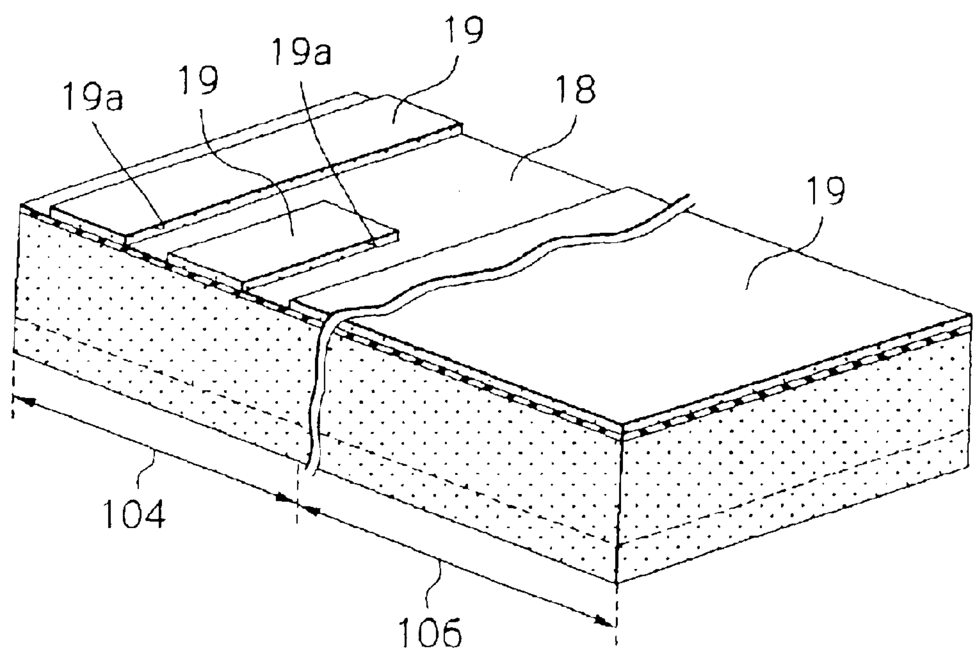

Specific processes of manufacturing the semiconductor memory of the illustrative embodiment will be described with reference to FIGS. 14A through 25. First, as shown in FIG. 14A, the planer substrate 12 of P type silicon or one-conductivity type semiconductor is prepared. The semiconductor substrate 12 is made up of the P+ type substrate 12*b* having boron concentration of $4.0\times10^{18}$ cm$^{-2}$ and P type epitaxial layer 12*a* formed on the substrate 12*b* and having boron concentration of $1.0\times10^{15}$ cm$^{-2}$. A silicon thermal oxide layer 18 is formed on one of the primary surfaces of the semiconductor substrate 12 beforehand. Subsequently, as shown in FIG. 14B, the silicon nitride layer 19 is formed on the silicon thermal oxide layer 18 and then patterned to form an aperture 19*a*.

In the illustrative embodiment, the production of the cell transistors can be executed in parallel with the production of CMOS transistors. A procedure for producing CMOS transistors will be described hereinafter together with the procedure for producing the cell transistors. In the figures, a CMOS transistor portion 104 refers to a portion allocated to a CMOS transistor to be formed later while a cell transistor portion 106 refers to a portional located to the cell transistor. The aperture 19*a* is included in the CMOS transistor portion. It is of course to be noted that in those figures only a single cell transistor portion or a single CMOS transistor portion is illustrated for simplicity but in practice a lot of cell transistors and a lot of CMOS transistors are fabricated in those process on the semiconductor substrate.

Figure 15A:
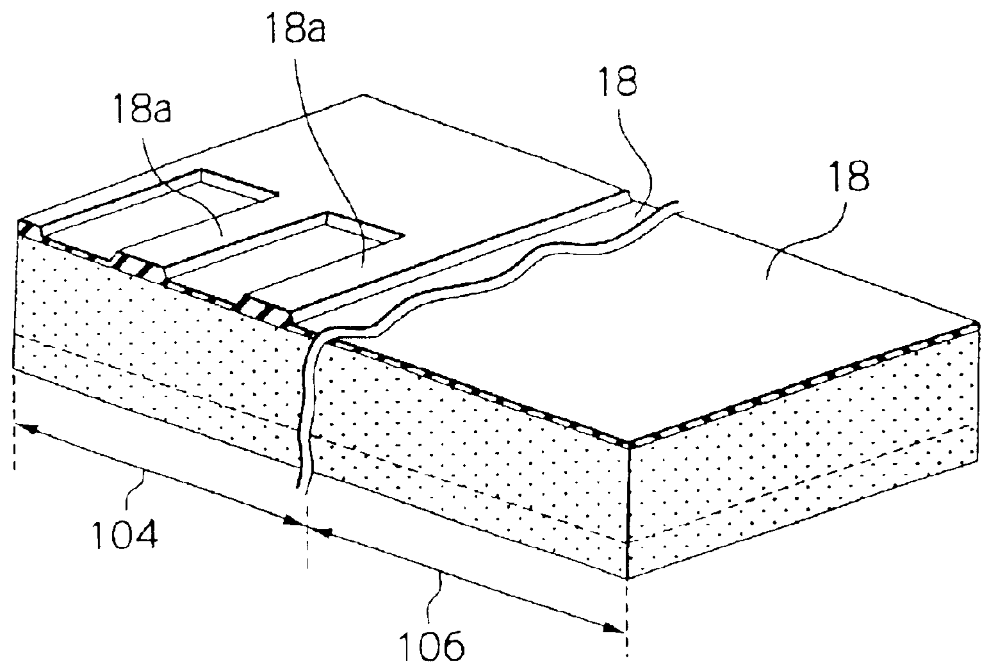

Subsequently, as shown in FIG. 15A, a field oxide layer 18 is formed. More specifically, the field oxide layer 18*a* is caused to grow with the silicon nitride layer 19, FIG. 14B, serving as a mask. After the growth of the field oxide layer 18*a*, the silicon nitride layer 19 is removed by etching.

Figure 15B:
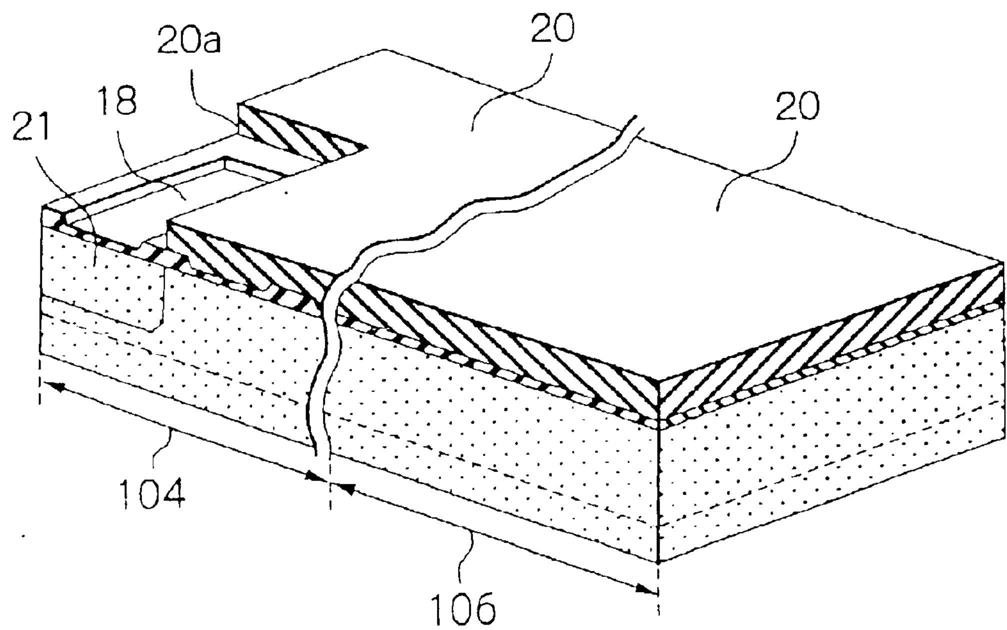

After the step of FIG. 15A, as shown in FIG. 15B, a photoresist layer 20 is coated on the entire surface of the laminate and then exposed and developed to form an aperture 20*a*. Subsequently, arsenic ions are implanted over the photoresist layer or mask to thereby form an N type well 21 beneath the aperture 20*a*. Thereafter, the photoresist layer 20 is removed.

Figure 16A:
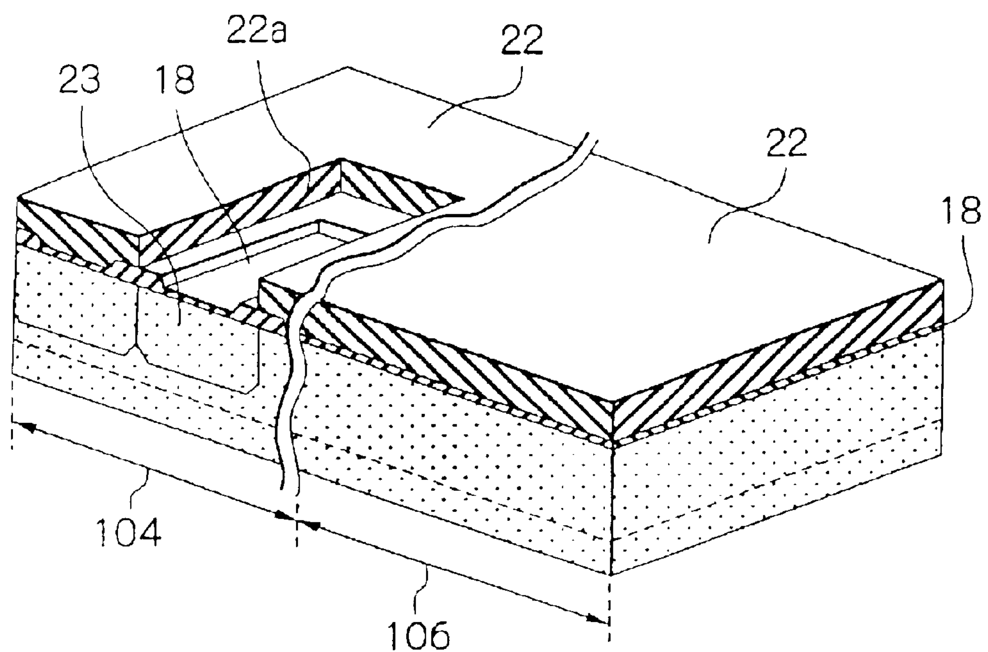

As shown in FIG. 16A, after the formation of the N type well 21, photoresist layer 22 is newly coated on the entire surface of the laminate and then exposed and developed to form an aperture 22*a*. Subsequently, boron ions are implanted over the photoresist layer or mask 22 to thereby form a P type well 23 beneath the aperture 22*a*. Thereafter, the photoresist layer 22 is removed.

Figure 16B:
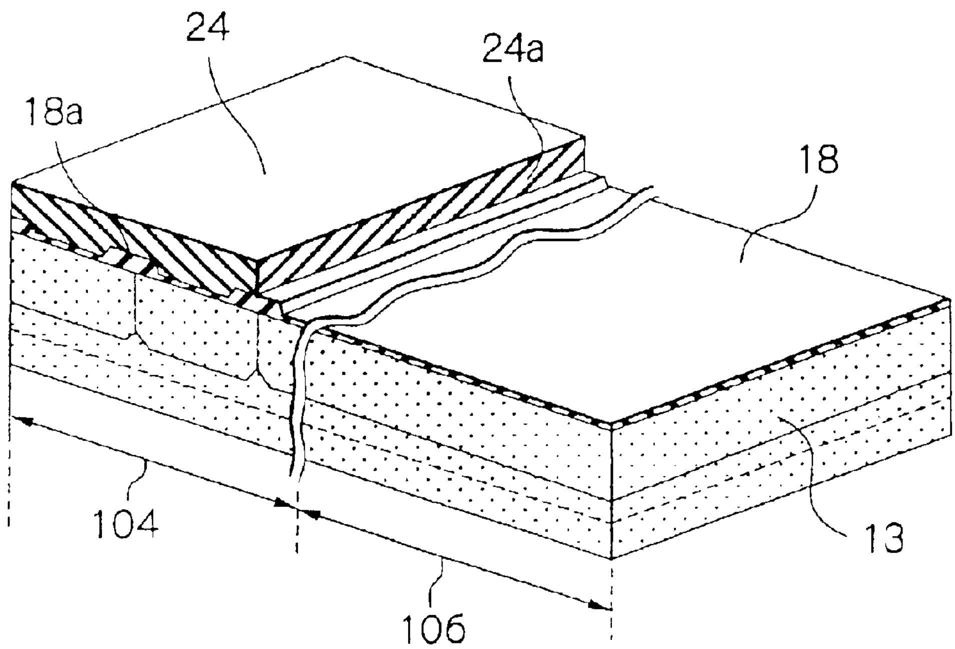

After the step of FIG. 16B, photoresist layer 24 is coated on the entire surface of the laminate and then exposed and developed to form an aperture 24*a*, which is positioned at the top of the cell transistor portion. Ions are implanted over the photoresist layer or mask 24 to thereby form the P type well 13. More specifically, ions are implanted four consecutive times under the following conditions. An ion seed is BF2 for the first and second ion implantation and is B (boron) for the third and fourth ion implantation. Acceleration energy is 15 keV for the first ion implantation, 45 keV for the second ion implantation, 20 keV for the third ion implantation, and 40 keV for the fourth ion implantation. Further, a dose is $5.0\times10^{11}$ cm$^{-2}$ for the first ion implantation, $5.0\times10^{11}$ cm$^{-2}$ for the second ion implantation, $6.0\times10^{12}$ cm$^{-2}$ for the third ion implantation, and $5.0\times10^{12}$ cm$^{-2}$ for the fourth ion implantation.

Figure 26:
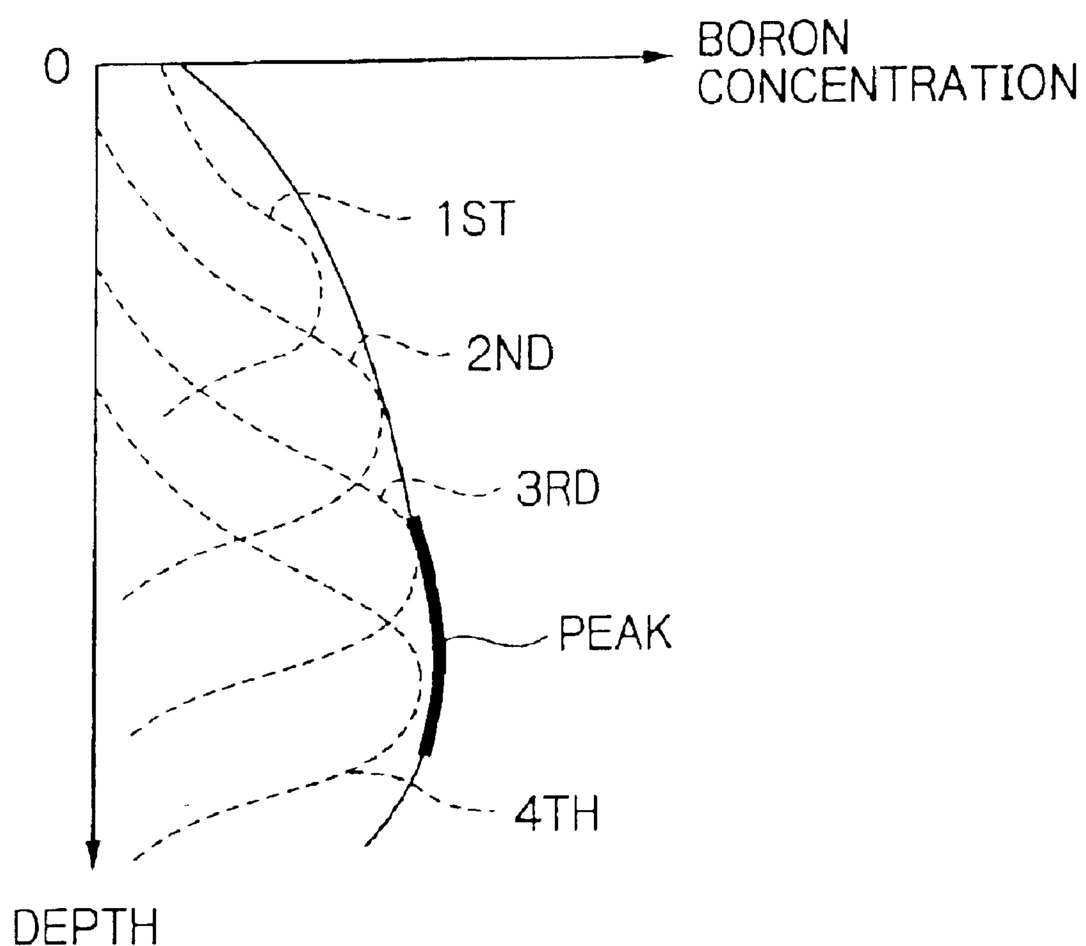
FIG. 26 is a graph plotting a relation between the depth of a P type well included in the illustrative embodiment, as measured from a surface, and boron concentration.

The P type well 13 subjected to the four times of ion implantation has a boron concentration distribution shown in FIG. 26. Specifically, FIG. 26 shows a relation between the depth of the P type well 13, as measured from the surface, and boron concentration. In FIG. 26, net boron concentration is represented by an envelope (solid curve) enveloping the boron concentrations of the consecutive times of ion implantation. As shown, the boron concentration distribution has a peak indicated by the bold portion of the curve. It is preferable to make the peak flat by suitably adjusting the implantation conditions and to cause the flat portion to extend in the direction of depth as far as possible, as will be understood from FIG. 17B to be described later.

Figure 17A:
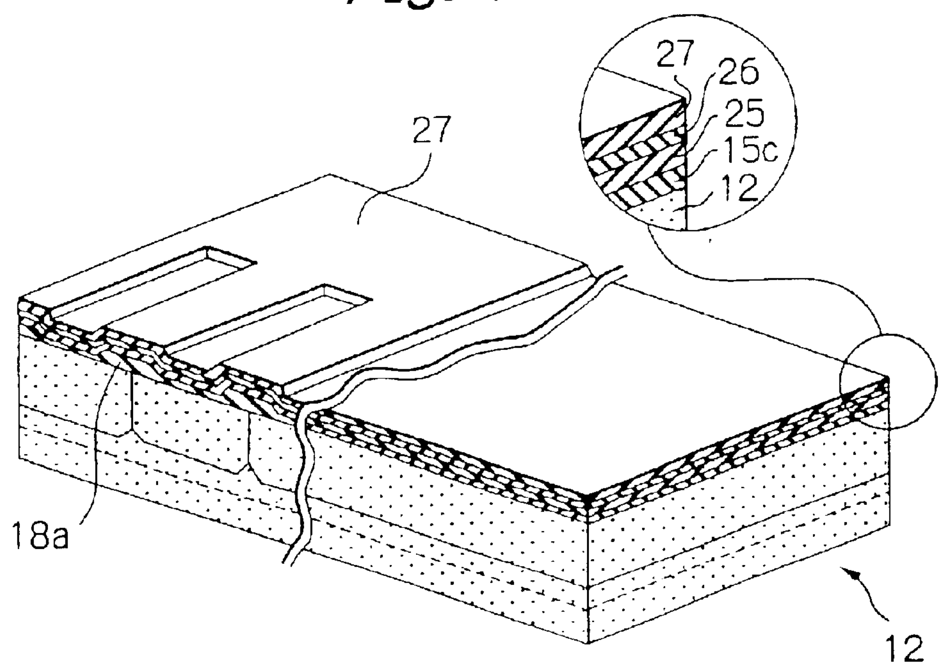

FIG. 17A shows a step to be executed after the step shown in FIG. 16B. As shown, the silicon thermal oxide layer 18 is etched out with the field oxide layer 18*a* being left on the laminate. Subsequently, the surface of the substrate 12 is again subjected to thermal oxidation for thereby forming the gate insulation layer 15*c*, which is about 10 nm thick. The silicon nitride layer 25 that is about 10 nm thick, silicon oxide layer 26 that is about 4 nm thick and silicon nitride layer 27 that is about 50 nm are sequentially formed on the gate insulation layer 15*c*. The functions of such layers, which are formed by a conventional CVD (Chemical Vapor Deposition) method, will be understood from the description of steps to follow.

Figure 17B:
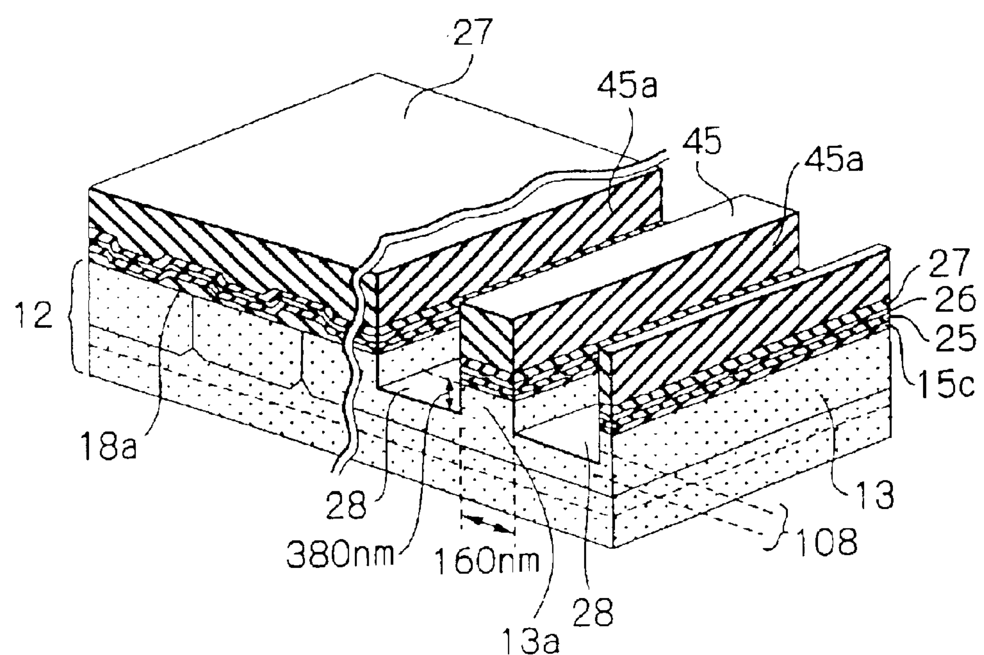

As shown in FIG. 17B, photoresist layer 45 is coated on the silicon nitride layer 27 positioned on the top of the above laminate. The photoresist layer 45 is then exposed and developed to form stripe-like apertures 45*a*. Subsequently, etching is effected over the photoresist layer or mask 45 to thereby open the silicon nitride layers 25 and 27, silicon oxide layer 26, and gate insulation layer 15*c*. Thereafter, the P type silicon substrate 12 is etched via the openings of the above layers so as to form trenches 28 such that the bottoms of the trenches 28 coincide with the peak of the boron concentration, see FIG. 26. The peak of the boron concentration is made flat and extends as deep as possible in the step of FIG. 16B, as stated earlier. Therefore, the bottom of each trench 28 can surely coincide with the peak of the boron concentration even if the depth of the trench 28 is inaccurate for process reasons.

Figure 11:
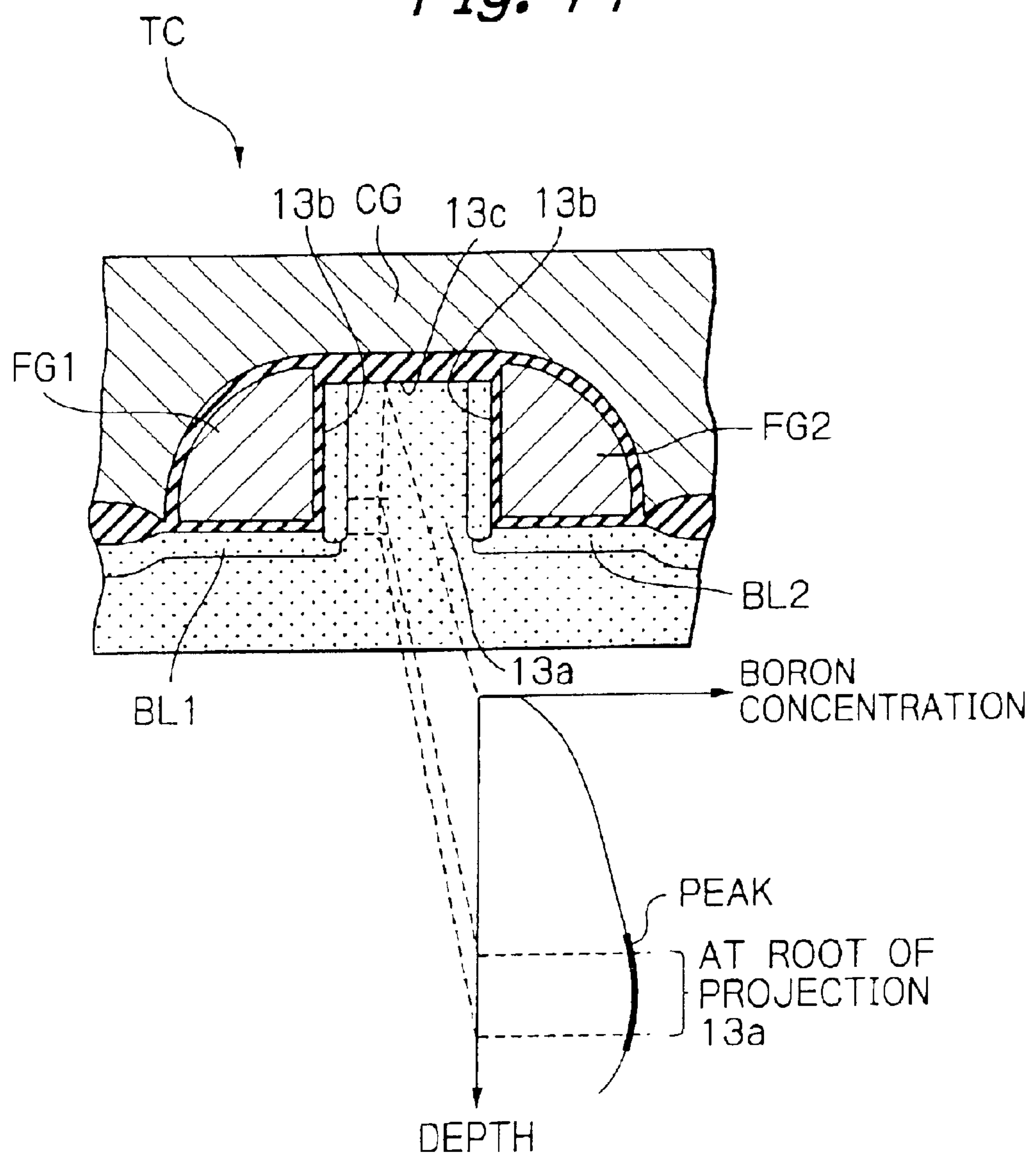
FIG. 11 shows a section of the cell transistor of the illustrative embodiment with the boron concentration distribution of a projection shown in connection therewith.

By the procedure described so far, there are formed the projections 13*a* each having high boron concentration at its root portion, as described with reference to FIG. 11. Although impurity concentration at the root portion has great influence on the threshold voltage $V_{th}$, the threshold voltage $V_{th}$ is prevented from varying because the bottom of each trench 28 surely coincides with the peak 108 of the boron concentration.

While the size of each trench 28 is open to choice, the trench 28 is about 380 nm in the illustrative embodiment. Also, the distance between nearby trenches 28, i.e. the width of the projection 13*a* is about 160 nm. After the formation of the trenches 28, the photoresist layer 45 is removed.

Figure 18A:
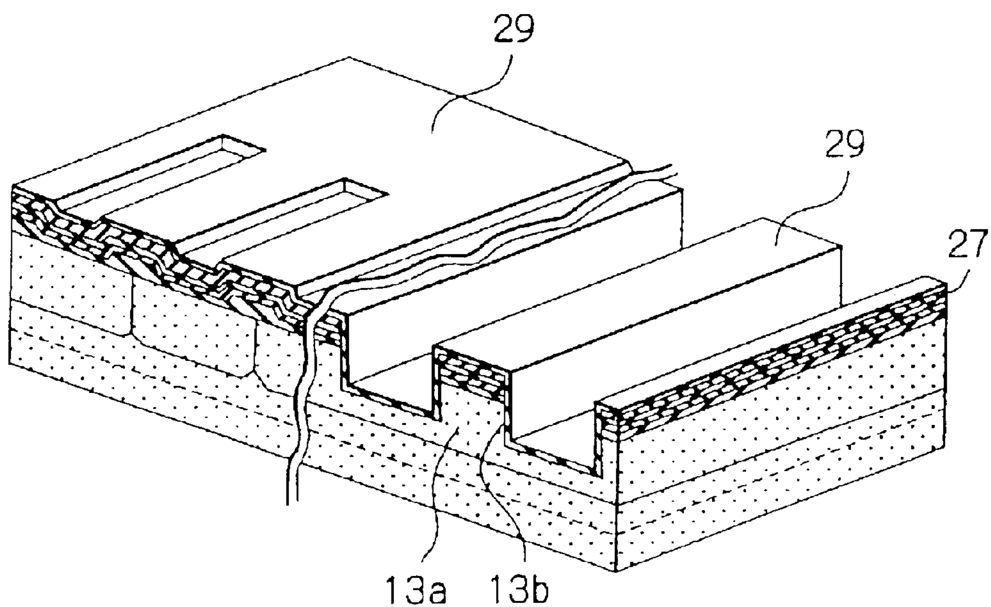
Figure 18B:
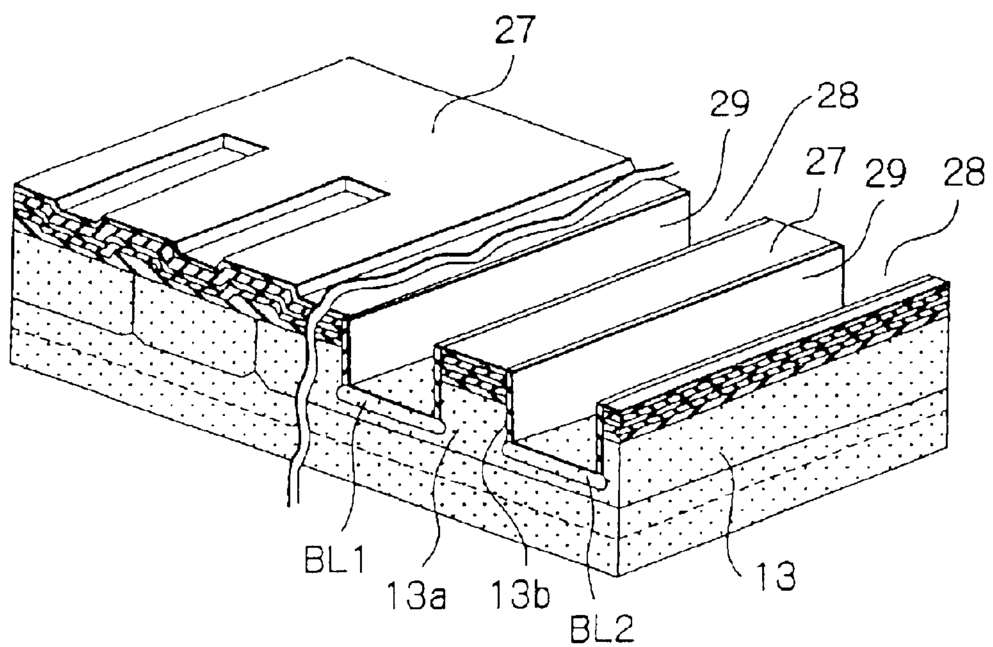

As shown in FIG. 18A, after the step of FIG. 17B, the silicon oxide layer 29 that is about 20 nm is formed on the entire exposed surface of the laminate by the CVD method. Subsequently, as shown in FIG. 18B, the silicon oxide layer 29 is subjected to anisotropic etching in the direction of thickness by RIE (Reactive Ton Etching). As a result, the silicon oxide layer 29 is removed except for part thereof present on the side walls 13*b* of the projection 13*a*.

After the removal of the silicon oxide layer 29, arsenic ions (As) are implanted to form the bit lines BL1 and BL2 in the bottoms of the trenches 28. At this instant, the silicon oxide layer 29 left on the side walls 13*b* prevent arsenic ions from being implanted in the side walls 13*b*. Further, the projection 13*a*, which serves as a mask, allows the bit lines BL1 and BL2 to be formed in the bottoms of the trenches 28 by a self-alignment process. The arsenic ions are implanted with acceleration energy of 15 keV in a dose of $2.0\times10^{14}$ $cm^{-2}$.

After the implantation of arsenic ions, the silicon oxide layer 29 present on the side walls 13*a* are etched by about 10 nm to be thinned thereby. Because the etched silicon oxide layer 29 is extremely thin, it is not shown in the figures to follow.

Figure 19A:
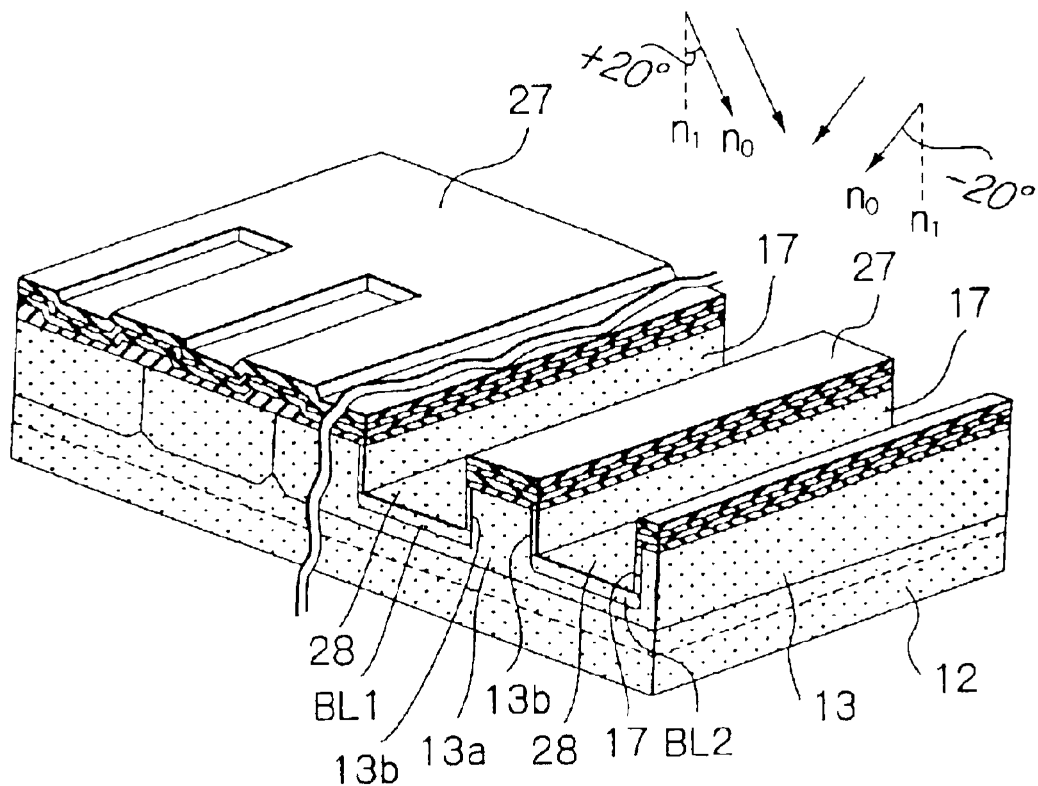

FIG. 19A shows a step to be executed after the step of FIG. 18B. As shown, arsenic ions are implanted in the side walls 13*b* of the projection 13*a* to thereby form the N type regions 17 of counter-conductivity type on the side walls 13*b*. This implantation can be done if the substrate 12 is tilted relative to the direction of implantation. In the illustrative embodiment, a line n1 normal to the P type silicon substrate 12 is inclined by about +/−20° relative to the direction of implantation. At this time, arsenic ions are implanted with acceleration energy of 10 keV in a dose of $5.0\times10^{11}$ $cm^{-2}$. It is noteworthy that the thin silicon oxide layer 29 present on the side walls 13*b*, see FIG. 18B, prevent the arsenic ions from being excessively implanted in the side walls 13*b*.

The surface layers of the trenches 28 are expected to implement the channel of the device, so that the property of the surface layers has critical influence on the device characteristics. It is therefore necessary to protect the surfaces of the trenches 28 from contamination in the steps to follow. For this purpose, in the illustrative embodiment, an about 4 nm thick, sacrifice silicon oxide layer 31 is formed on the sides and bottoms of the trenches 28 by thermal oxidation. The sacrifice silicon oxide layer 31 successfully protects the surfaces of the trenches 28 from contamination. Moreover, this layer 31 serves to remove a lattice defect particular to the surface layers of the trenches 28, thereby preventing the device characteristics from being degraded. Subsequently, an about 60 nm thick, nitride layer or mask 30 is formed on the entire exposed surface of the laminate inclusive of the inside of the trenches 28 by the CVD method.

Figure 19B:
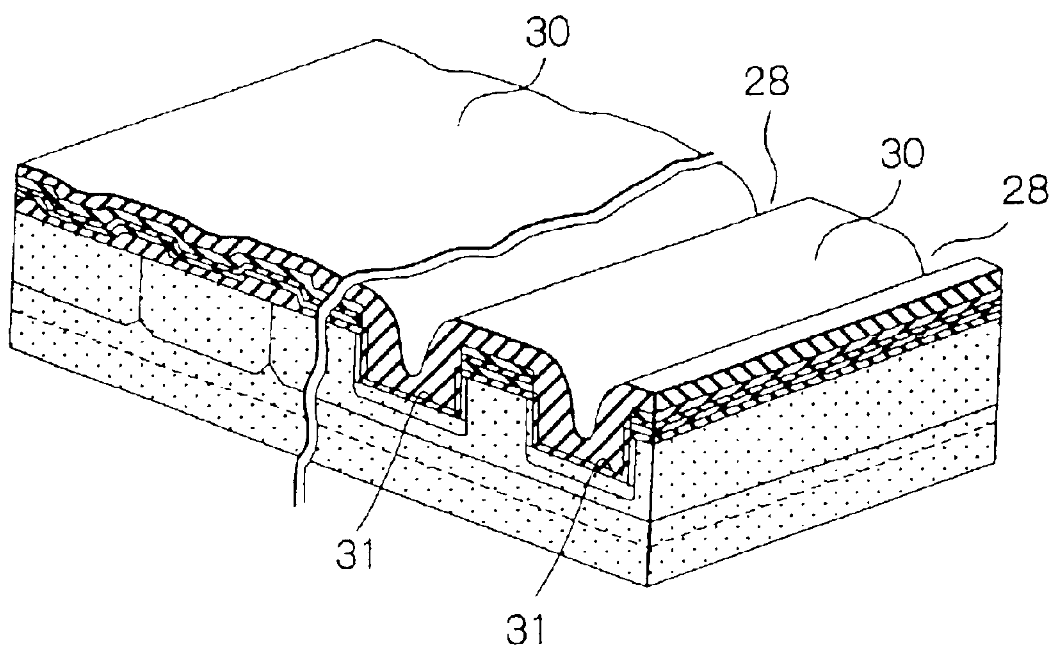
Figure 20A:
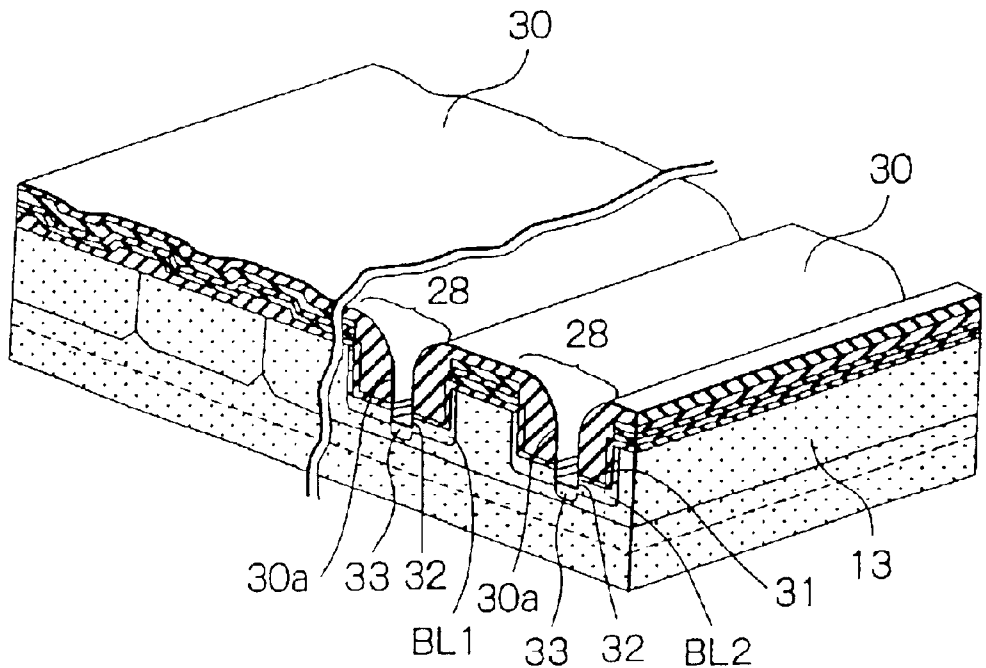

As shown in FIG. 20A, after the step of FIG. 19B, the silicon nitride layer 30 is subjected to anisotropic etching in the direction of thickness in order to form elongate grooves 30*a*. It should be noted that each groove 30*a* is smaller in width than the trench 28. Subsequently, the sacrifice silicon oxide layer 31 and part of the bit lines BL1 and BL2 are selectively etched with the silicon nitride layer 30 serving as a mask. As a result, recesses 32 are formed in the bit lines BL1 and BL2 to a depth of about 10 nm each.

After the recesses 32 have been formed, arsenic ions are implanted in the bit lines BL1 and BL2 via the grooves 30*a* in order to lower the resistance of the bit lines BL1 and BL2. At this time, the arsenic ions are implanted with acceleration energy of 30 keV in a dose of $3.0\times10^{15}$ $cm^{-2}$. In FIG. 20A, the portions where the arsenic ions are implanted are designated by the reference numeral 33.

Figure 27A:
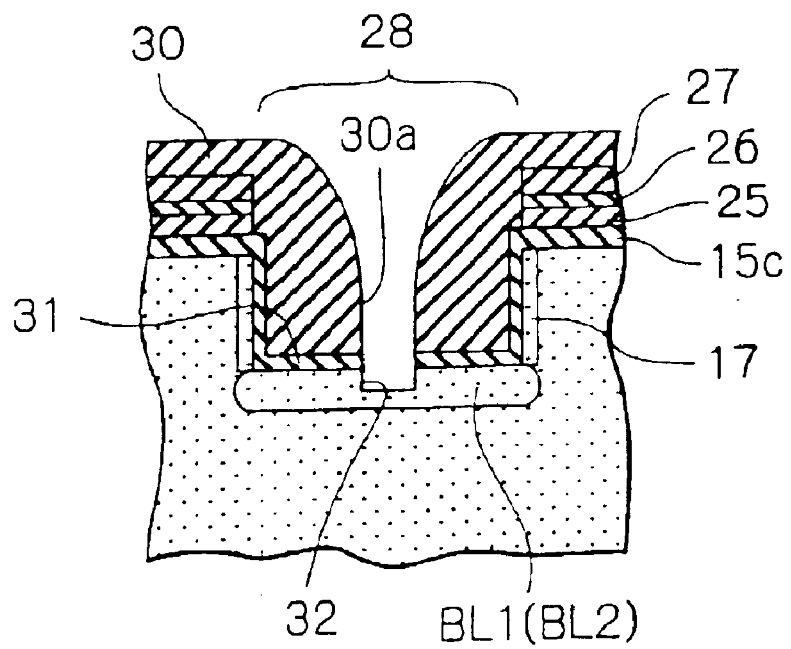
FIGS. 27A and 27B are cross-sectional views respectively showing conditions before and after ion implantation unique to the illustrative embodiment.
Figure 27B:
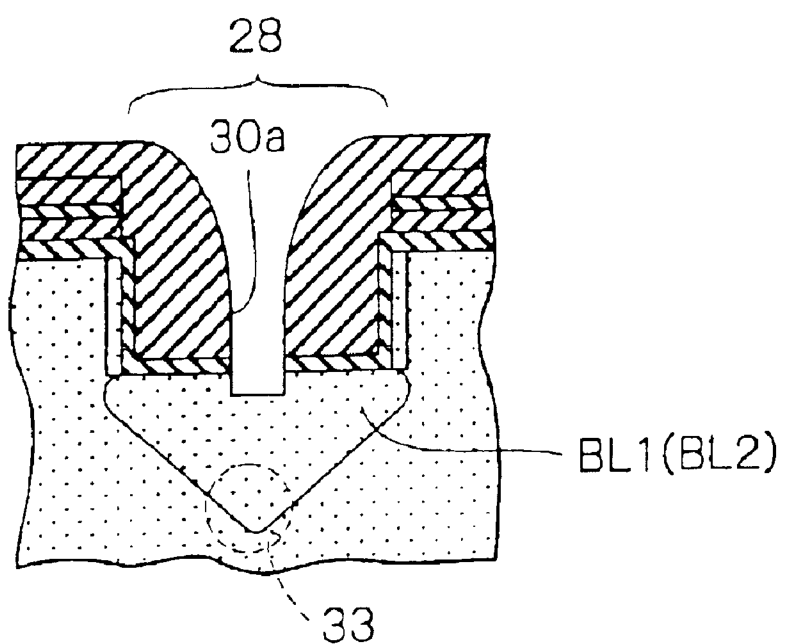

FIGS. 27A and 27B respectively show the condition before the above ion implantation and the condition after the same. As shown, the ion implantation is effected via each groove 30*a* smaller in width than the trench 28, so that arsenic ions are sharply implanted in the bit line BL1 (BL2) without being scattered sideways. It is therefore possible to lower the resistance of the bit lines BL1 and BL2 while reducing the probability that nearby bit lines BL1 and BL2 are punched through due to the scattering of arsenic.

Figure 20B:
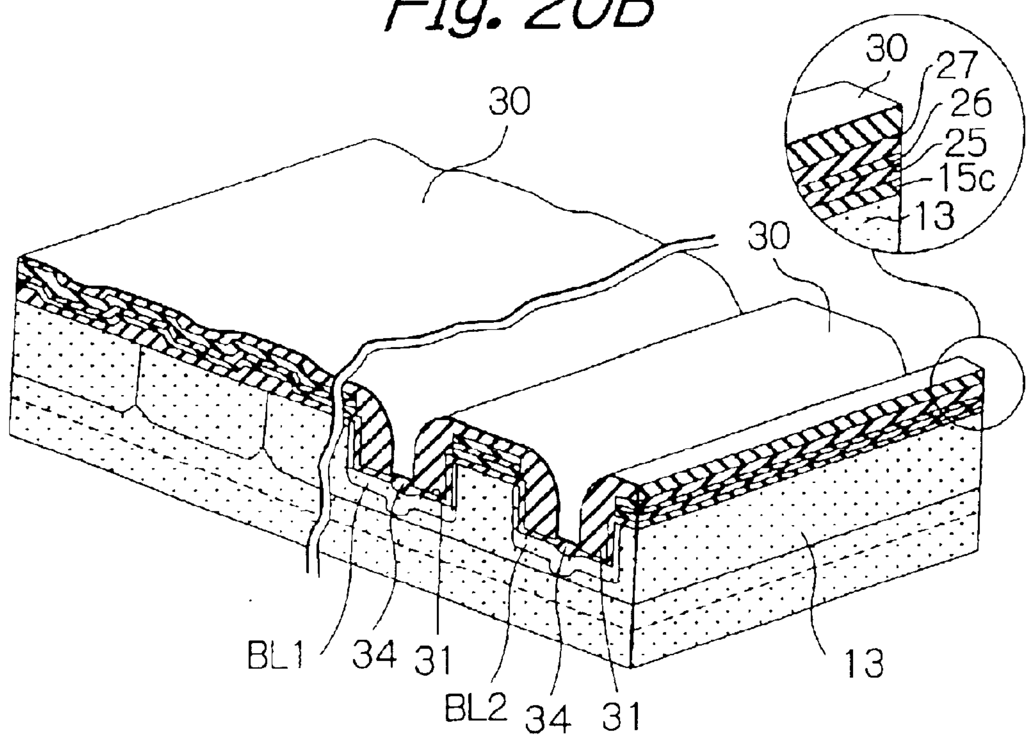

Subsequently, as shown in FIG. 20B, the recesses 32 are selectively oxidized with the silicon nitride layer 30 serving as a mask, thereby forming the selective oxide layers or fourth insulation layers 34. Alternatively, to form the selective oxide layers 34, the surfaces of the bit lines BL1 and BT2 may be oxidized in the step of FIG. 20B without the recesses 32 being formed in the step of FIG. 20A. This alternative method, however, produces bird's beak in the selective oxide layers 34 between the surfaces of the bit lines BL1 and BL2 and the sacrifice silicon oxide layer 31.

I found that bird's beak could be reduced if the recesses 32 were formed and then oxidized. If bird's beak does not matter, then the selective oxide layers 34 may be formed with the recesses 32 being omitted.

After the selective oxide layers 34 have been formed, the silicon nitride layers 27 and 30 are removed by etching. At this instant, the silicon oxide layer 26 and sacrifice silicon oxide layer 31 play the role of an etching stopper. Subsequently, the silicon oxide layer 26 is removed by etching with the silicon nitride layer 25 serving as an etching stopper. This etching is effected to such a degree that the silicon oxide layer 26 is fully removed, but the selective oxide layers 34 remain.

Figure 21A:
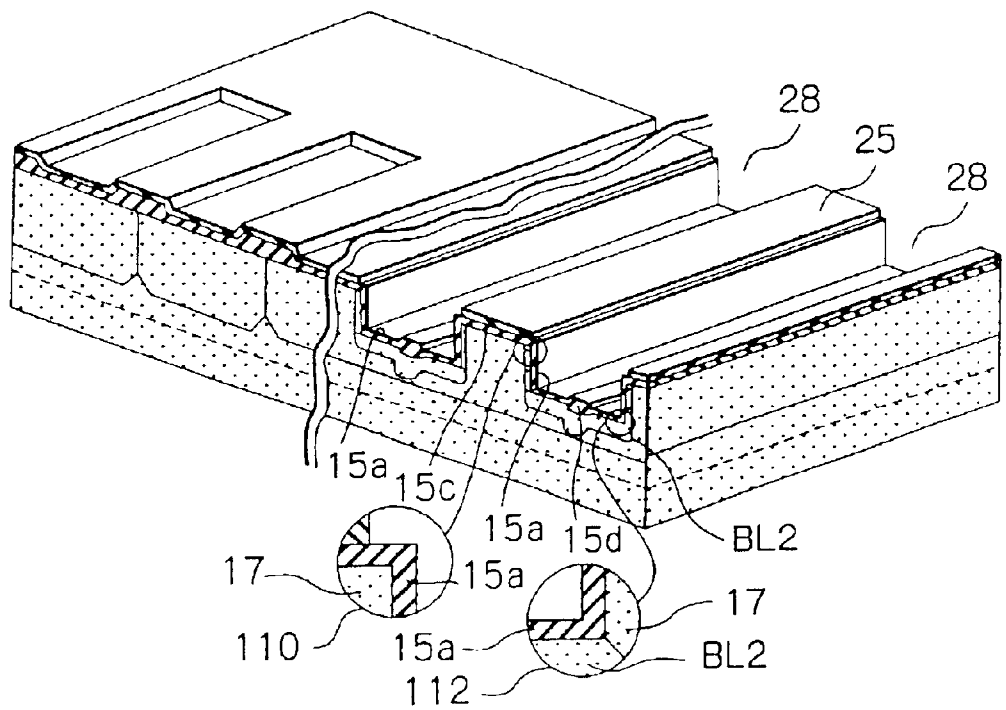

FIG. 21A shows a step to follow the step of FIG. 20B. As shown, the bottoms and sides of the trenches 28 are again oxidized to form tunnel insulation layers 15*a*. The tunnel insulation layers 15*a* should preferably be provided with desirable property because their property has critical influence on the device operation. For this purpose, the illustrative embodiment forms the tunnel insulation layers 15*a* by using plasma oxidation, which is implemented by a microwave excited, high density plasma device using a radial line slot antenna, and introducing a krypton (Kr) and oxygen ($O_2$) mixture gas in the plasma device.

In the plasma device mentioned above, Kr excited by a microwave hits against $O_2$ for thereby generating a great amount of atomic state oxygen O*. The atomic state oxygen O* easily enters the surface layers of the trenches 28 and oxidize the bottoms and sides of the trenches 28 at substantially the same rate without regard to the plane direction. Consequently, the tunnel insulation layers 15*a* having uniform thickness are formed in the corner portions of the trenches 28, as indicated in an enlarged view in circles 110 and 112. For details of plasma oxidation, reference may be made to, e.g. Paper No. 29p-YC-4, The 48th Joint Meeting of Engineers of Applied Physics of Japan and Japanese patent laid-open publication No. 2001-160555.

Figure 21B:
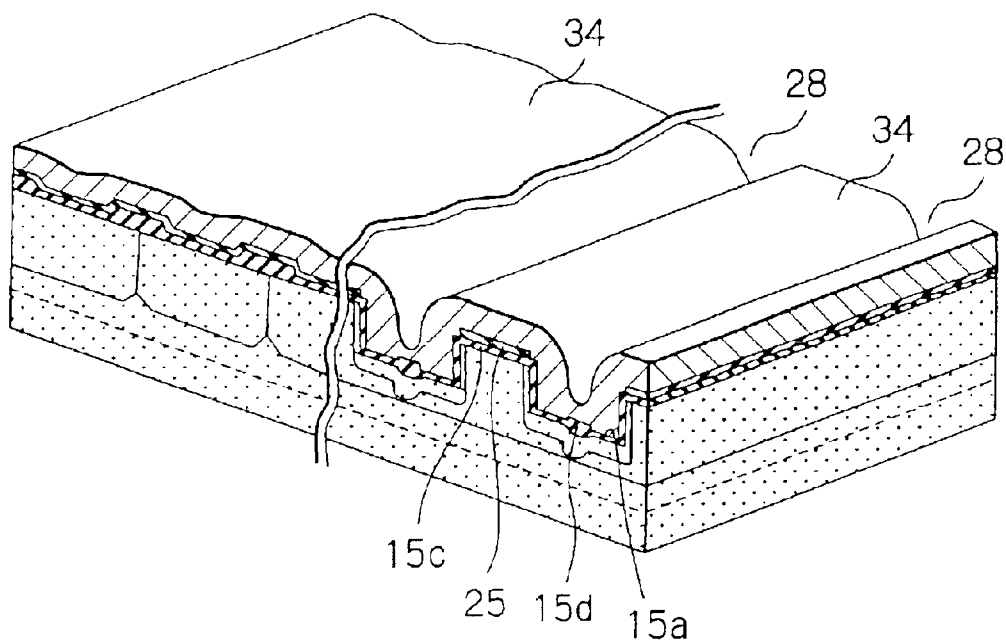

FIG. 21B shows a step to follow the step of FIG. 20B. As shown, the polycrystalline silicon layer or conductive layer 34, which is about 50 nm thick, is formed on the tunnel insulation layers 15*a* and silicon nitride layer 25. The polycrystalline silicon layer 34 is doped with phosphor (P) by an in-situ process beforehand.

Figure 22A:
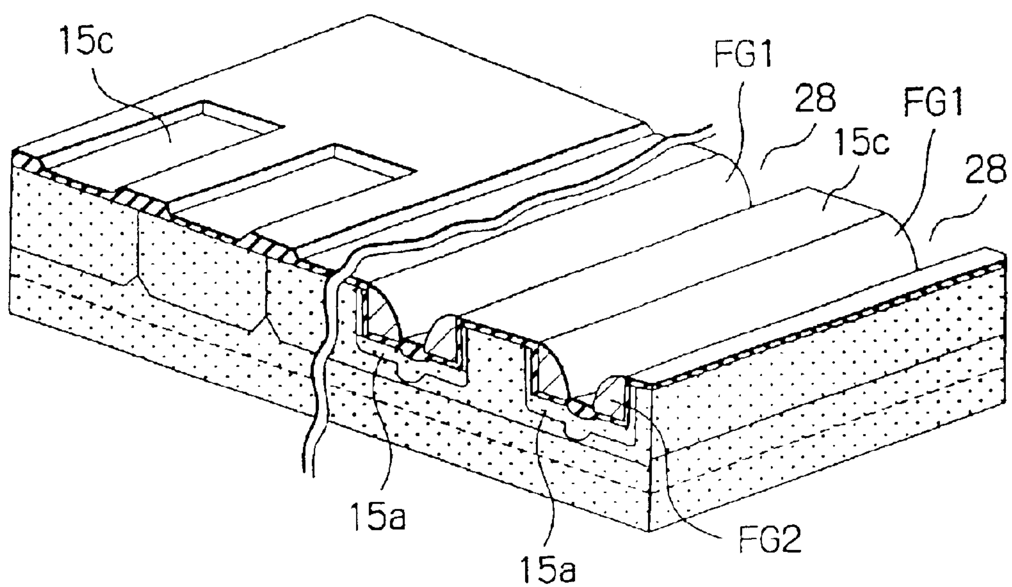
Figure 22B:
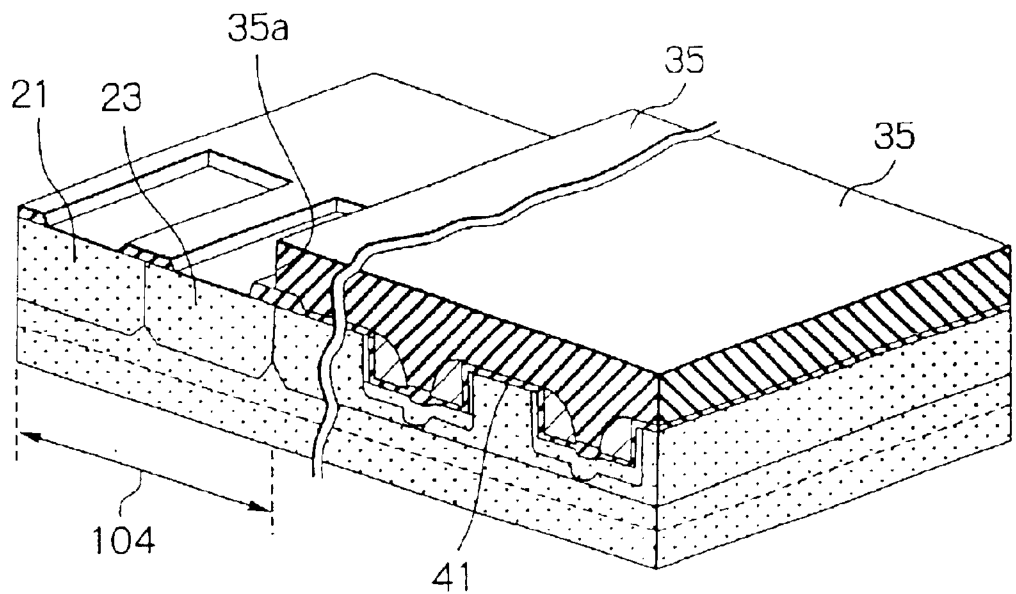

Subsequently, as shown in FIG. 22B, the polycrystalline silicon layer 34 is anisotropically etched in the direction of thickness or depth. As a result, the polycrystalline silicon layer 34 on the tunnel insulation layers 15*a* is removed, but is left on the tunnel insulation layers 15*a* on the sides of the trenches 28. The polycrystalline silicon layer 34 on the sides of the trenches 28 constitute the floating gates FG1 and FG2. Thereafter, the silicon nitride layer 25 is removed by etching.

Attention should be paid to the role that the silicon nitride layer 25, see FIG. 21B, has played up to this stage of production. The silicon nitride layer 25 has been formed on the gate insulation layer 15*c* in the step shown in FIG. 17A and has protected the gate insulation layers 15*a* up to the step shown in FIG. 21B. The gate insulation layer 15*c* has noticeable influence on the device operation. In this respect, the silicon nitride layer 25 protecting the gate insulation layer 15*c* prevents the property of the gate insulation layer 15*c* from being deteriorated during various processes including ion implantation, etching, and formation of layers of different kinds. Consequently, the operation characteristics of the device are protected from deterioration.

Subsequently, as shown in FIG. 22B, photoresist layer 35 is coated on the entire surface of the laminate and then exposed and developed to form an aperture 35*a* in the CMOS transistor portion. Thereafter, the gate insulation layer 15*c* in the CMOS transistor portion is etched with the photoresist layer 35 serving as a mask, thereby causing the surfaces of the N type well 21 and P type well 23 to be exposed to the outside.

Figure 23A:
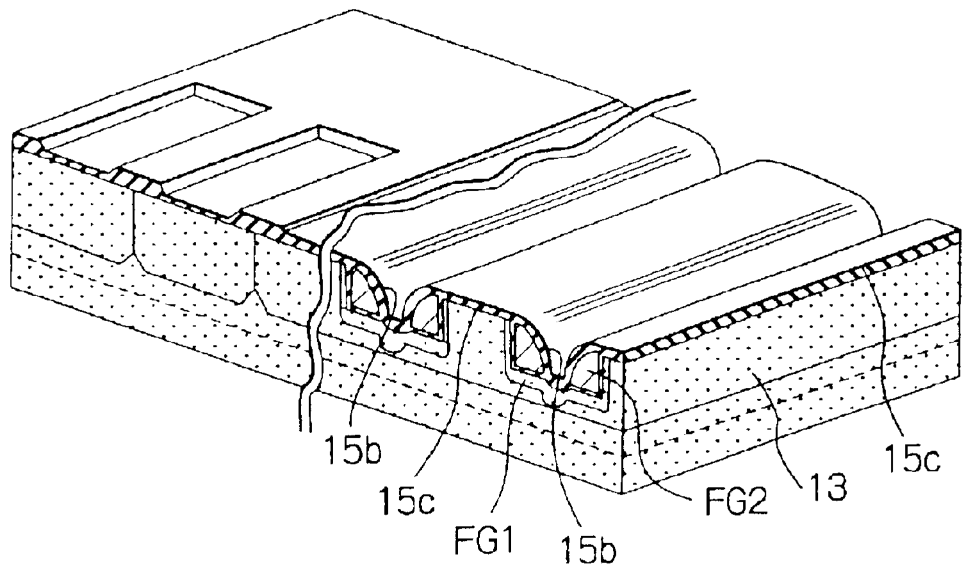

As shown in FIG. 23A, after the step of FIG. 22B, the entire exposed surface of the laminate is oxidized by plasma oxidation stated previously. This oxidizes silicon beneath the gate insulation layer 15*c* and thereby increases the thickness of the layer 15*c*. At the same time, the surfaces of the floating gates FG1 and FG2 are oxidized to form the inter-polycrystalline insulation layers 15*b*, which are about 8 nm thick each.

The floating gates FG1 and FG2 are formed of polycrystalline silicon, so that numerous crystal particles different in plane direction are formed on the surface of the floating gates FG1 and FG2. However, plasma oxidation allows a silicon oxide layer to be uniformly formed without regard to the plane direction, as stated earlier. This obviates an occurrence that the inter-polycrystalline insulation layer 15*b* is locally thinned and has its insulation characteristic deteriorated at thinner portions. This advantage is achievable even when polycrystalline silicon is doped with phosphor.

Figure 23B:
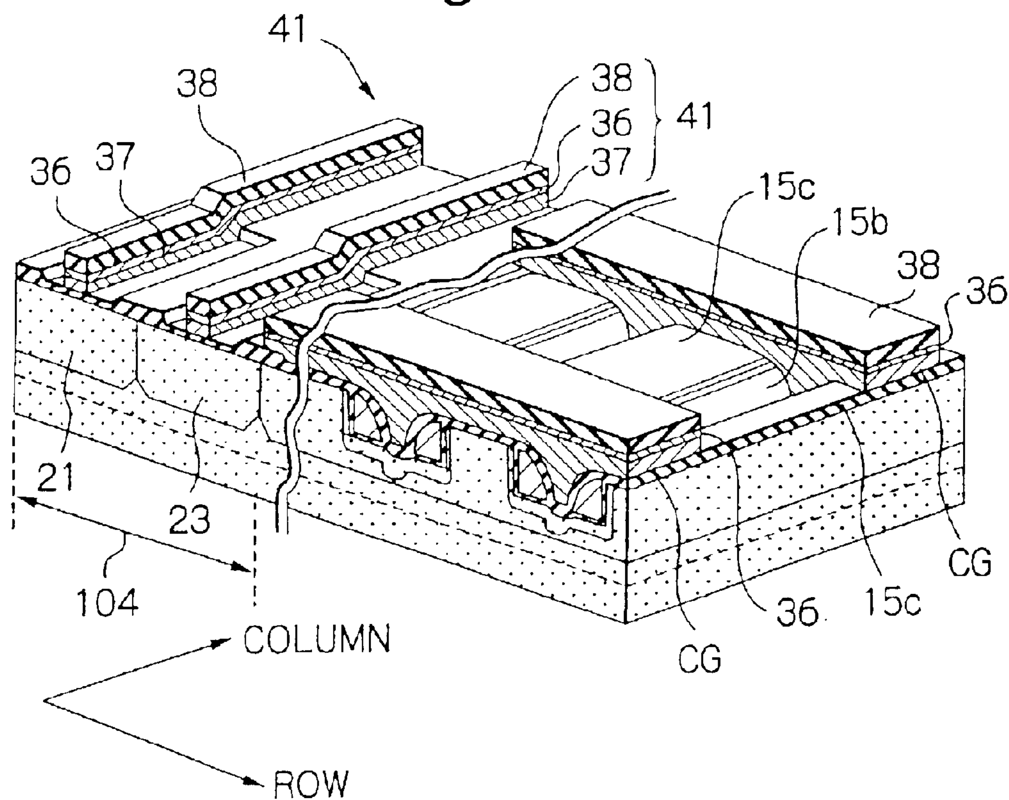

FIG. 23B shows a step to be executed after the step of FIG. 23A. As shown, a polycrystalline silicon layer, which is expected to constitute the control gate CG, is formed on the entire exposed surface of the laminate. The polycrystalline silicon layer is doped with phosphor by an in-situ process beforehand. Subsequently, a WSi layer 36 is formed on the polycrystalline silicon layer. Further, a cap layer 38 implemented as a silicon oxide layer is formed on the WSi layer 36. Thereafter, such layers lying one above the other are patterned to produce the structure shown in FIG. 23B.

By the step of FIG. 23B, a plurality of control gates CG are formed integrally with each other in the direction of row. At the same time, gate electrodes 41 are formed above the P type well 23 and N type well 21, respectively, which are included in the CMOS transistor portion. The gate electrodes 41 each are mainly implemented by the polycrystalline silicon layer 37 and have resistance thereof lowered by the WSi layer 36. The WSi layer 36 also present in each control gate CG lowers the resistance of the control gate as well CG.

Figure 24A:
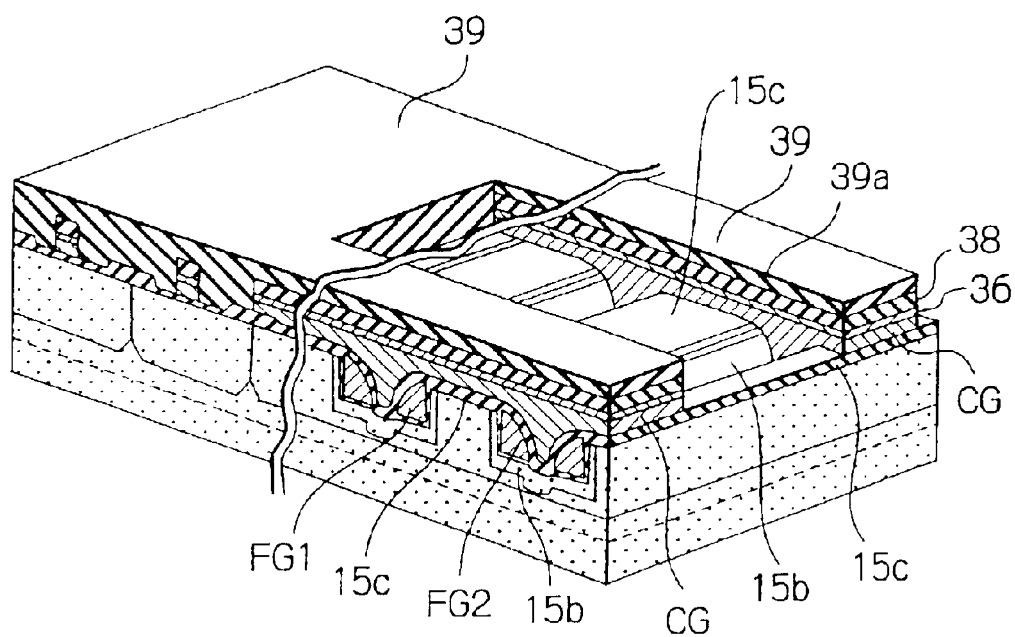
Figure 24B:
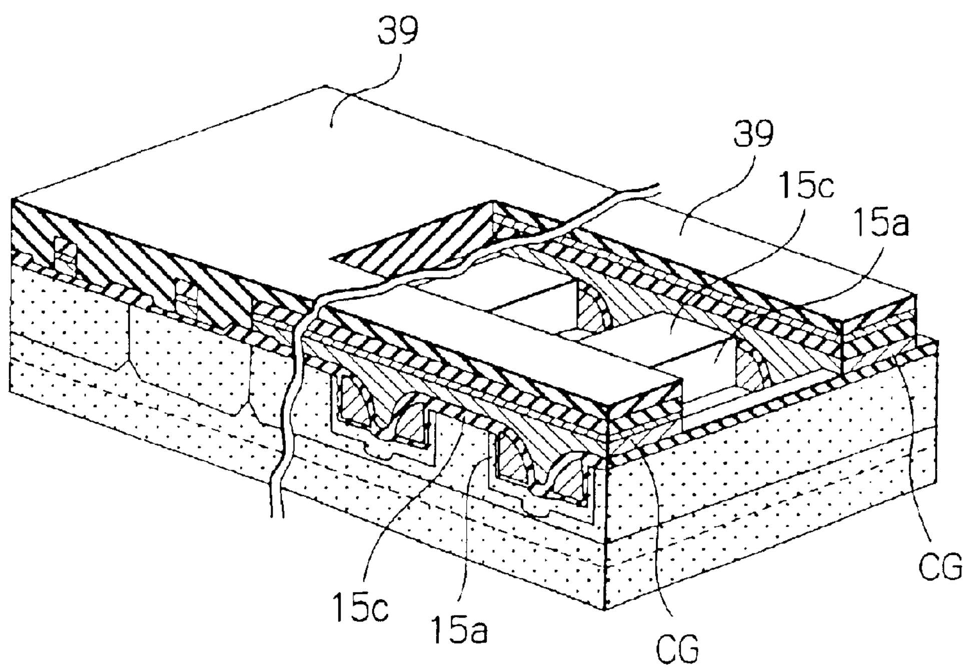

As shown in FIG. 24A, after the step of FIG. 23B, photoresist layer 39 is coated on the entire surface of the laminate and then exposed and developed to form an aperture 39*a* between the adjoining control gates CG. Subsequently, as shown in FIG. 24B, the portions of the inter-polycrystalline insulation layers 15*b* not covered with the control gates CG are removed by etching with the photoresist layer 39 serving as a mask. At this instant, the gate insulation layers 15*c* between the control gates CG are slightly etched. Thereafter, the portions of the floating gates FG1 and FG2 not covered with the control gates CG are removed by etching using a different etchant. As a result, the tunnel insulation layers 15*a* are exposed to the outside between the adjoining control gates CG.

Figure 25:
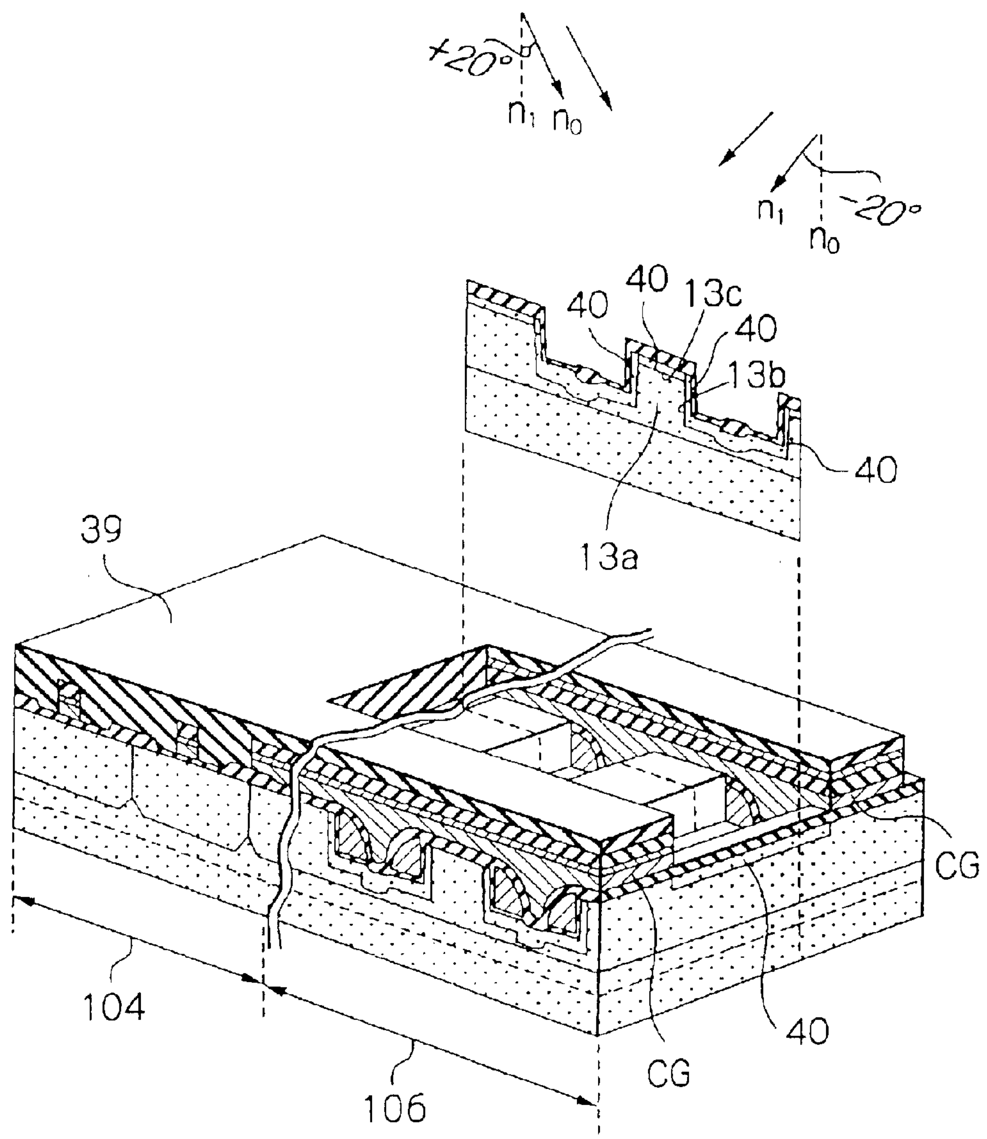

Finally, as shown in FIG. 25, isolation regions 40 are formed on the side walls 13*b* and top 13*c* of each projection 13*a* not covered with the control gates CG. While the side walls 13*b* and top 13*c* form a channel below the associated control gate CG, the isolation region 40 electrically isolates such channels below nearby control gates CG. To form the isolation regions 40, boron ions are implanted over the photoresist layer or mask 39. At this instant, the substrate 12 is tilted relative to the direction of implantation such that the isolation regions 40 are formed on the side walls 13*b* of the projections 13*a*. In the illustrative embodiment, the line $n_1$ normal to the P type silicon substrate 12 is tilted by about +/−20° relative to the direction of implantation no, as stated earlier. More specifically, $BF_2$, which is a seed, is implanted with acceleration energy of 20 keV in a dose of $1.0\times10^{13}$ $cm^{-2}$.

Subsequently, the photoresist layer 39 is removed to complete the semiconductor memory 10 shown in FIG. 1.

The CMOS portion is completed with source/drain regions formed at preselected positions.

While in the illustrative embodiment P type and N type are respectively used as one-conductivity type and counter-conductivity type, N type and P type may, of course, be used as one-conductivity type and counter-conductivity type, respectively.

In summary, it has been or will be seen that the present invention provides a transistor, a semiconductor memory using the same and a method of manufacturing a transistor having the following various unprecedented advantages.

A channel is not formed in a region linearly connecting source/drain regions, but is formed bidimensionally in a region spaced from the above region. Therefore, a sufficient channel length is achievable with a minimum of area or space, promoting the miniaturization of a transistor.

A carrier on the channel flows bidimensionally in the region linearly connecting the source/drain regions, so that a floating gate is positioned in the direction in which the carrier advances. Therefore, in a write mode, the carrier can be injected into the floating gate straight forward without being steered at all. This lowers a voltage necessary for accelerating the carrier and thereby makes a write voltage lower than conventional one.

Counter-conductivity type regions are formed on the side walls of each projection so as to enhance voltage drop on the top of the projection, so that the carrier is sharply accelerated on the top. This further lowers the write voltage. Such an advantage is also achievable even when the thickness of a first insulation layer formed on the top of the projection is increased or when a one-conductivity type impurity region higher in impurity concentration than the one-conductivity type projection is formed on the top.

The potential of floating gates is attracted by the potential of the counter-conductivity type regions of the projection, the potential of the source/drain regions and the potential of the control gate due to capacities between such members. It is therefore possible to increase or decrease a drain current to a desired value and therefore to broaden a current window. In addition, because electrons can be selectively injected into either one of the floating gates, in which of the floating gates electrons exist is clear even when the cell size is reduced.

When the cell transistor is not selected, despite that various potentials for selecting another cell are applied to the source/drain regions, the floating gates are attracted toward the potential of the source/drain regions by capacitance between the floating gates and the source/drain regions. Consequently, second insulation layers are not exposed to an intense electric field, allowing resistance to inter-band tunneling to be enhanced.

The one-conductivity type impurity concentration at the root portion of the projection is increased, so that the source/drain regions at both sides of the projection are sparingly punched through. In this case, because the counter-conductivity type regions are present on the side walls of the projection, the counter-conductivity type impurity of such regions and the one-conductivity type impurity of the root portion of the projection compensate each other. This prevents the threshold voltage of the transistor from excessively increasing.

By arranging cell transistors each having the above advantages in the directions of row and column, there can be constituted a memory array. At this instant, a fourth insulation layer thicker than the second insulation layers and contiguous with the second insulation layers is formed between the cell transistors adjoining each other in the direction of row. The fourth insulation layer reduces leak current between the source/drain regions and the control gate.

A counter-conductivity type region higher in concentration than each source/drain region is formed in the source/drain region in order to lower the resistance of the source/drain region. This successfully prevents the operation speed of the device from being lowered.

The method of manufacturing a semiconductor memory of the present invention protects the first insulation layer with a protection layer and then removes the protection layer after the formation of the floating gates. The first insulation layer is therefore protected from damage during various processes up to the formation of the floating gates.

After the removal of the protection layer, the exposed surface of the first insulation layer and the exposed surfaces of the floating gates are oxidized. This allows the first insulation layer to be thickened and allows third insulation layers to be formed on the surfaces of the floating gates.

A masking layer is formed in each trench and then formed with a narrow groove, so that an impurity of counter-conductivity type can be sharply implanted in the source/drain region via the groove without being scattered sideways. It is therefore possible to lower the resistance of the source/drain regions while preventing the source/drain regions from being punched through due to the scattering of the impurity.

The source/drain regions each are selectively etched via the above groove in order to form a recess. Subsequently, the recess is selectively oxidized. This allows a fourth insulation layer thicker than the second insulation layer to be formed while causing a minimum of bird's beak to appear.

A one-conductivity type impurity is implanted in the one-conductivity type semiconductor substrate a plurality of times to thereby form a peak in the distribution of one-conductivity type impurity concentration. The method of the present invention can make the peak flat and extend it deep into the substrate. The bottom of the recess can therefore surely coincide with the peak without regard to irregularity in the depth of the groove, thereby preventing the threshold voltage of the transistor from varying.

The entire disclosure of Japanese patent application Nos. 2001-336822 and 2002-303845 filed on Nov. 1, 2001, and Oct. 18, 2002, respectively, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A transistor comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates; and a control gate facing said pair of floating gates via said third insulation layers and facing the top of the projection via said first insulation layer;

the projection having a root portion formed to virtually connect said source/drain regions with a straight line, the root portion being higher in concentration of the one conductivity type of impurity than a remaining portion of the projection.

2. The transistor in accordance with claim 1, wherein said control gate comprises:

first control gate segments facing said floating gates via said third insulation layers; and a second control gate segment facing the top of the projection via said first insulation layer, said first and second control gates being formed to be electrically interconnected.

3. The transistor in accordance with claim 1, wherein said control gate comprises:

first control gate segments facing said floating gates via said third insulation layers; and a second control gate segment facing the top of the projection via said first insulation layer, said first and second control gates being formed to be controlled electrically independently of each other.

4. The transistor in accordance with claim 1, wherein each of said floating gates partly protrudes above the top of the projection.

5. The transistor in accordance with claim 1, wherein each of said floating gates does not cover the top of the projection.

6. A transistor comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates;

a control gate facing said pair of floating gates via third insulation layers and facing the top of the projection via said first insulation layer; and counter-conductivity type regions formed on the side walls of the projection and contacting said source/drain regions.

7. The transistor in accordance with claim 6, wherein said control gate comprises:

first control gate segments facing said floating gates via said third insulation layers; and a second control gate segment facing the top of the projection via said first insulation layer, said first and second control gates being formed to be electrically interconnected.

8. The transistor in accordance with claim 6, wherein said control gate comprises:

first control gate segments facing said floating gates via said third insulation layers; and a second control gate segment facing the top of the projection via said first insulation layer, said first and second control gates being formed to be controlled electrically independently of each other.

9. The transistor in accordance with claim 6, wherein said counter-conductivity type regions have impurity concentration that is substantially $1/100$ to $1/10,000$ of impurity concentration of said source/drain regions.

10. The transistor in accordance with claim 6, wherein each of said floating gates partly protrudes above the top of the projection.

11. The transistor in accordance with claim 6, wherein each of said floating gates does not cover the top of the projection.

12. A transistor comprising:

a one-conductivity type semiconductor substrate formed with a projection having a pair of side walls facing each other;

a first insulation layer formed on a tap of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates; and a control gate facing said pair of floating gates via third insulation layers and facing the top of the projection via said first insulation layer;

said control gate forming a first capacitance against the top of the projection via said first insulation layer, said floating gates forming a second capacitance against the side walls of the projection and said source/drain regions via said second insulation layers, the second capacitance being higher than the first capacitance.

13. The transistor in accordance with claim 12, wherein said control gate comprises:

first control gate segments facing said floating gates via said third insulation layers; and a second control gate segment facing the top of the projection via said first insulation layer, said first and second control gates being formed to be electrically interconnected.

14. The transistor in accordance with claim 12, wherein said control gate comprises:

first control gate segments facing said floating gates via said third insulation layers; and a second control gate segment facing the top of the projection via said first insulation layer, said first and second control gates being formed to be controlled electrically independently of each other.

15. The transistor in accordance with claim 12, wherein each of said floating gates partly protrudes above the top of the projection.

16. The transistor in accordance with claim 12, wherein each of said floating gates does not cover the top of the projection.

17. A transistor comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates; and a control gate facing said pair of floating gates via third insulation layers and facing the top of the projection via said first insulation layer;

said floating gates being coupled in capacitance with a second capacitance established against the side walls sad of the projection and said source/drain regions via said second insulation layers, and a third capacitance established against said control gate via said third insulation layers, the second capacitance being formed larger.

18. The transistor an accordance with claim 17, wherein said control gate comprises:

first control gate segments facing said floating gates via said third insulation layers; and a second control gate segment facing the top of the projection via said first insulation layer, said first and second control gates being formed to be electrically interconnected.

19. The transistor in accordance with claim 17, wherein said control gate comprises:

first control gate segments facing said floating gates via said third insulation layers; and a second control gate segment facing the top of the projection via said first insulation layer, said first and second control gates being formed to be controlled electrically independently of each other.

20. The transistor in accordance with claim 17, wherein each of said floating gates partly protrudes above the top of the projection.

21. The transistor in accordance with claim 17, wherein each of said floating gates does not cover the top of the projection.

22. A semiconductor memory comprising a plurality of cell transistors arranged in a direction of row and a direction of column, each of said plurality of cell transistors comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed an one of said floating gates; and a control gate facing said pair of floating gates via said third insulation layers and facing the top of the projection via said first insulation layer;

the projection having a root portion formed to connect said source/drain regions with a straight line, the root portion being higher in concentration of the one conductivity type of impurity than a remaining portion of the projection.

23. The semiconductor memory in accordance with claim 22, wherein ones of said cell transistors adjoining each other in the direction of column share the same source/drain regions, and ones of said cell transistors adjoining each other in the direction of row share said control gate and share said same source/drain regions therebetween.

24. The semiconductor memory in accordance with claim 22, wherein said plurality of cell transistors are arranged in a direction connecting said source/drain regions, a fourth insulation layer being formed between one of said floating gates of one of said cell transistors and the other floating gate of another of said plurality of cell transistors adjacent said one cell transistor to electrically isolate said control gate from said source/drain regions.

25. A semiconductor memory comprising a plurality of cell transistors arranged in a direction of row and a direction of column, each of said plurality of cell transistors comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates;

a control gate facing said pair of floating gates via third insulation layers and facing the top of the projection via said first insulation layer; and counter-conductivity type regions formed on the side walls of the projection and contacting said source/drain regions.

26. The semiconductor memory in accordance with claim 25, wherein ones of said cell transistors adjoining each other in the direction of column share the same source/drain regions, and ones of said cell transistors adjoining each other in the direction of row share said control gate and share said same source/drain regions therebetween.

27. The semiconductor memory in accordance with claim 25, wherein said plurality of cell transistors are arranged in a direction connecting said source/drain regions, a fourth insulation layer being formed between one of said floating gates of one of said cell transistors and the other floating gate of another of said plurality of cell transistors adjacent said one cell transistor to electrically isolate said control gate from said source/drain regions.

28. A semiconductor memory comprising a plurality of cell transistors arranged in a direction of row and a direction of column, each of said plurality of cell transistors comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates; and a control gate facing said pair of floating gates via third insulation layers and facing the top of the projection via said first insulation layer;

said control gate forming a first capacitance against the top of the projection via said first insulation layer, said floating gates forming a second capacitance against the side walls of the projection and said source/drain regions via said second insulation layers, the second capacitance being higher than the first capacitance.

29. The semiconductor memory in accordance with claim 28, wherein ones of said cell transistors adjoining each other in the direction of column share the same source/drain regions, and ones of said cell transistors adjoining each other in the direction of row share said control gate and share said flame source/drain regions therebetween.

30. The semiconductor memory in accordance with claim 28, wherein said plurality of cell transistors are floating gates of one of said cell transistors and the other floating gate of another of said plurality of cell transistors adjacent said one cell transistor to electrically isolate said control gate from said source/drain regions.

31. A semiconductor memory comprising a plurality of cell transistors arranged in a direction of row and a direction of column, each of said plurality of cell transistors comprising:

a one-conductivity type semiconductor substrate formed with a projection having a pair of side walls facing each other;

a first insulation layer formed on a top of the projection;

a pair of source/drain regions formed on a surface of said semiconductor substrate at both sides of the projection;

second insulation layers each, covering one of the pair of side walls and one of said source/drain regions adjoining the side wall;

a pair of floating gates respectively formed on the pair of side walls of the projection and respectively facing the side walls and said source/drain regions via respective second insulation layers;

third insulation layers each being formed on one of said floating gates; and a control gate facing said pair of floating gates via third insulation layers and facing the top of the projection via said first insulation layer;

said floating gates being coupled in capacitance with a second capacitance established against the side walls and of the projection and said source/drain regions via said second insulation layers, and a second third capacitance established against said control gate via said third insulation layers, the second capacitance being formed larger.

32. The semiconductor memory in accordance with claim 31, wherein ones of said cell transistors adjoining each other in the direction of column share the same source/drain regions, and ones of said cell transistors adjoining each other in the direction of row share said control gate and share said same source/drain regions therebetween.

* * * * *